(12) United States Patent
Yun et al.

(10) Patent No.: US 12,176,417 B2
(45) Date of Patent: Dec. 24, 2024

(54) SEMICONDUCTOR DEVICES

(71) Applicant: Samsung Electronics Co., Ltd., Suwon-si (KR)

(72) Inventors: Seungchan Yun, Incheon (KR); Donghwan Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 42 days.

(21) Appl. No.: 18/329,206

(22) Filed: Jun. 5, 2023

(65) Prior Publication Data

US 2023/0317824 A1 Oct. 5, 2023

Related U.S. Application Data

(63) Continuation of application No. 17/019,767, filed on Sep. 14, 2020, now Pat. No. 11,670,701.

(30) Foreign Application Priority Data

Dec. 18, 2019 (KR) .................. 10-2019-0169763

(51) Int. Cl.
*H01L 29/66* (2006.01)
*H01L 21/8234* (2006.01)
(Continued)

(52) U.S. Cl.
CPC .. *H01L 29/6656* (2013.01); *H01L 21/823431* (2013.01); *H01L 29/1033* (2013.01);
(Continued)

(58) Field of Classification Search
CPC ... H01L 27/0617–0623; H01L 27/0635; H01L 27/0705–0722;
(Continued)

(56) References Cited

U.S. PATENT DOCUMENTS 9,214,358 B1 * 12/2015 Lin ................ H01L 21/845
9,245,885 B1 1/2016 Xie et al.
(Continued)

FOREIGN PATENT DOCUMENTS

KR 10-2009-0012793 2/2009
KR 10-2016-0002306 1/2016
(Continued)

OTHER PUBLICATIONS

Notice of Allowance in Korean Appln. No. 10-2019-0169763, mailed on May 21, 2024, 8 pages (with English translation).

*Primary Examiner* — Maliheh Malek
(74) *Attorney, Agent, or Firm* — Fish & Richardson P.C.

(57) ABSTRACT

A semiconductor device including a substrate including first and second regions, a first transistor on the first region and including a first semiconductor pattern protruding from the first region; a first gate structure covering an upper surface and sidewall of the first semiconductor pattern; first source/drain layers on the first semiconductor pattern at opposite sides of the first gate structure, upper surfaces of the first source/drain layers being closer to the substrate than an uppermost surface of the first gate structure; and a second transistor on the second region and including a second semiconductor pattern protruding from the second region; a second gate structure covering a sidewall of the second semiconductor pattern; and a second source/drain layer under the second semiconductor pattern; and a third source/drain layer on the second semiconductor pattern, wherein the upper surface of the first region is lower than the upper surface of the second region.

20 Claims, 46 Drawing Sheets

(51) Int. Cl.
    *H01L 29/10*     (2006.01)
    *H01L 29/423*     (2006.01)
    *H01L 29/78*     (2006.01)

(52) U.S. Cl.
    CPC .... *H01L 29/42392* (2013.01); *H01L 29/7851* (2013.01); *H01L 29/7855* (2013.01); *H01L 21/823487* (2013.01); *H01L 2029/7858* (2013.01)

(58) Field of Classification Search
    CPC ..... H01L 27/085–098; H01L 21/82345; H01L 21/823456; H01L 21/823462; H01L 21/8236; H01L 21/823842; H01L 21/82385; H01L 21/823857; H01L 29/78696; H01L 29/0665; H01L 29/6656; H01L 21/823807; H01L 21/823864; H01L 29/41766; H01L 27/2454; H01L 29/7827; H01L 21/823487; H01L 21/823885; H01L 2924/13067; H01L 2029/7857–7858; H01L 29/04–045; H01L 29/16–1608; H01L 29/18–185; H01L 29/22–2206; H01L 29/36–365; H01L 29/41791; H01L 29/66795–66818; H01L 29/785–7856; H01L 27/0886; H01L 27/0924; H01L 27/10826; H01L 27/10879; H01L 27/1211; H01L 21/823431; H01L 21/823821; H01L 21/845
    See application file for complete search history.

(56) References Cited

U.S. PATENT DOCUMENTS

| | | | |
|---|---|---|---|
| 9,312,186 B1* | 4/2016 | Su | H01L 29/775 |
| 9,406,669 B2 | 8/2016 | Chuang et al. | |
| 9,496,256 B2 | 11/2016 | Wang et al. | |
| 9,698,261 B2 | 7/2017 | Wang et al. | |
| 9,741,716 B1* | 8/2017 | Cheng | H01L 21/823456 |
| 9,870,952 B1 | 1/2018 | Cheng et al. | |
| 9,911,657 B2* | 3/2018 | Cheng | H01L 29/1083 |
| 9,911,738 B1* | 3/2018 | Niimi | H01L 29/7827 |
| 10,163,900 B2 | 12/2018 | Xie et al. | |
| 10,332,803 B1 | 6/2019 | Xie et al. | |
| 10,475,923 B1* | 11/2019 | Cheng | H01L 21/823418 |
| 10,497,811 B2 | 12/2019 | Wang et al. | |
| 10,566,331 B1* | 2/2020 | Yang | H01L 21/02603 |
| 10,707,208 B2* | 7/2020 | Cheng | H01L 27/0886 |
| 10,784,344 B2 | 9/2020 | Song et al. | |
| 10,804,260 B2* | 10/2020 | Zhou | H01L 29/0657 |
| 10,985,073 B2* | 4/2021 | Xie | H01L 29/66545 |
| 11,043,587 B2* | 6/2021 | Balakrishnan | H01L 21/02532 |
| 11,482,619 B2* | 10/2022 | Han | H01L 21/823475 |
| 11,502,168 B2* | 11/2022 | Hsu | H01L 27/092 |
| 11,532,723 B2* | 12/2022 | Lin | H01L 29/42392 |
| 11,545,489 B2* | 1/2023 | You | H01L 27/088 |
| 11,791,338 B2* | 10/2023 | Huang | H01L 29/401 257/369 |
| 2002/0111025 A1* | 8/2002 | Weybright | H01L 21/76897 257/E21.654 |
| 2007/0057331 A1* | 3/2007 | Satou | H01L 21/823456 257/E21.624 |
| 2009/0032887 A1 | 2/2009 | Jang et al. | |
| 2012/0132986 A1* | 5/2012 | Kang | H01L 27/088 257/329 |
| 2014/0264485 A1* | 9/2014 | Li | H01L 29/66795 257/288 |
| 2015/0325665 A1* | 11/2015 | Masuoka | H01L 29/7802 257/329 |
| 2016/0351569 A1* | 12/2016 | Song | H01L 29/4966 |
| 2017/0154821 A1* | 6/2017 | Cheng | H01L 29/93 |
| 2017/0243782 A1* | 8/2017 | Wu | H01L 21/308 |
| 2018/0337278 A1 | 11/2018 | Chi et al. | |
| 2019/0214473 A1* | 7/2019 | Xie | H01L 29/0649 |
| 2020/0161192 A1* | 5/2020 | Zhou | H01L 21/823821 |
| 2020/0258740 A1* | 8/2020 | Lee | H01L 29/66439 |
| 2021/0057488 A1* | 2/2021 | Hwu | H10N 70/011 |
| 2021/0104622 A1* | 4/2021 | Park | H01L 27/1214 |
| 2021/0126110 A1* | 4/2021 | Lin | H01L 21/823481 |
| 2021/0159327 A1* | 5/2021 | Yun | H01L 28/60 |
| 2021/0193834 A1* | 6/2021 | Yun | H01L 29/7827 |
| 2021/0217749 A1* | 7/2021 | Lee | H01L 21/76801 |
| 2022/0093735 A1* | 3/2022 | Song | H01L 29/0692 |
| 2022/0130957 A1* | 4/2022 | Kim | H01L 29/4236 |
| 2022/0130970 A1* | 4/2022 | Kang | H01L 29/41791 |
| 2022/0140075 A1* | 5/2022 | Shin | H01L 29/42392 257/401 |
| 2022/0149041 A1* | 5/2022 | Huang | H01L 21/28079 |
| 2022/0181459 A1* | 6/2022 | Cho | H01L 29/66439 |
| 2022/0181499 A1* | 6/2022 | Jung | H01L 29/0673 |
| 2022/0181500 A1* | 6/2022 | Ha | H01L 29/78618 |
| 2022/0208967 A1* | 6/2022 | Ko | H01L 29/0653 |
| 2022/0216339 A1* | 7/2022 | Lee | H01L 21/76805 |
| 2022/0216348 A1* | 7/2022 | Kim | H01L 29/0665 |
| 2022/0223526 A1* | 7/2022 | Min | H01L 21/76834 |
| 2022/0238653 A1* | 7/2022 | Lee | H01L 29/1033 |
| 2022/0254881 A1* | 8/2022 | Park | H01L 29/6656 |
| 2022/0262955 A1* | 8/2022 | More | H01L 29/66439 |
| 2022/0285493 A1* | 9/2022 | Kim | H01L 29/66553 |
| 2022/0285511 A1* | 9/2022 | Park | B82Y 10/00 |
| 2022/0300693 A1* | 9/2022 | Do | G06F 30/392 |
| 2022/0302310 A1* | 9/2022 | Choi | H01L 29/775 |
| 2022/0310805 A1* | 9/2022 | Chun | H01L 29/775 |
| 2022/0320312 A1* | 10/2022 | Park | H01L 27/088 |
| 2022/0336585 A1* | 10/2022 | Shen | H01L 29/0673 |
| 2022/0336664 A1* | 10/2022 | Bae | H01L 29/66439 |
| 2022/0344206 A1* | 10/2022 | Hsiung | H01L 29/0653 |
| 2022/0367453 A1* | 11/2022 | Kim | H01L 29/66545 |
| 2022/0399331 A1* | 12/2022 | Kim | H01L 29/0665 |
| 2022/0406775 A1* | 12/2022 | Kim | H01L 21/823871 |
| 2022/0406914 A1* | 12/2022 | Lee | H01L 29/0665 |
| 2022/0406920 A1* | 12/2022 | Chao | H01L 29/775 |
| 2022/0406939 A1* | 12/2022 | Kim | H01L 29/66439 |
| 2023/0122374 A1* | 4/2023 | Hwu | H10B 63/30 257/390 |
| 2023/0189539 A1* | 6/2023 | Hwu | H01L 29/40117 257/4 |
| 2023/0326998 A1* | 10/2023 | Cai | H01L 29/42376 257/369 |
| 2024/0296890 A1* | 9/2024 | Huang | G11C 16/10 |

FOREIGN PATENT DOCUMENTS

| | | |
|---|---|---|
| KR | 10-2018-0069704 | 6/2018 |
| KR | 10-2019-0036773 | 4/2019 |

\* cited by examiner

FIG. 5
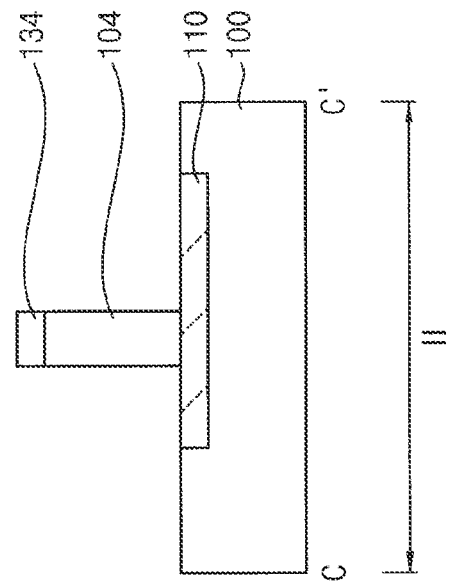
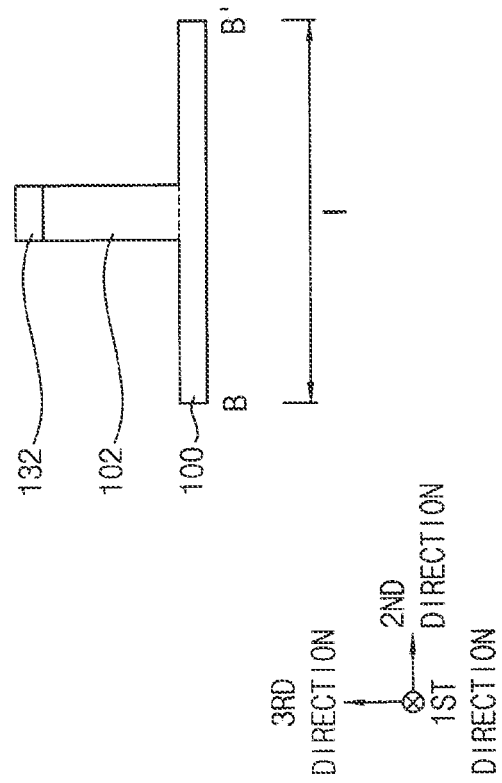

FIG. 13
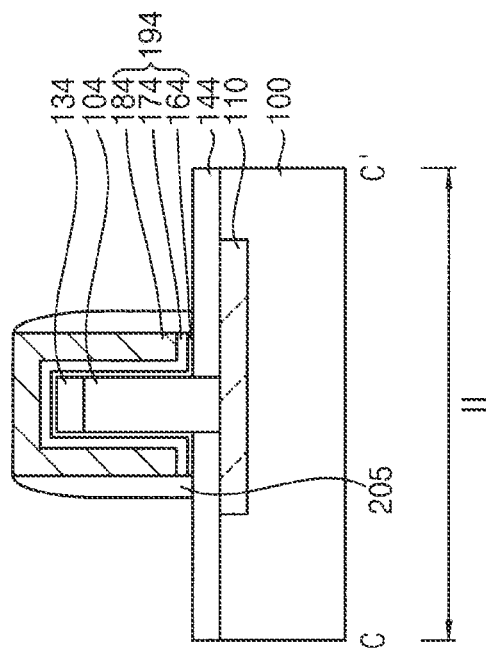
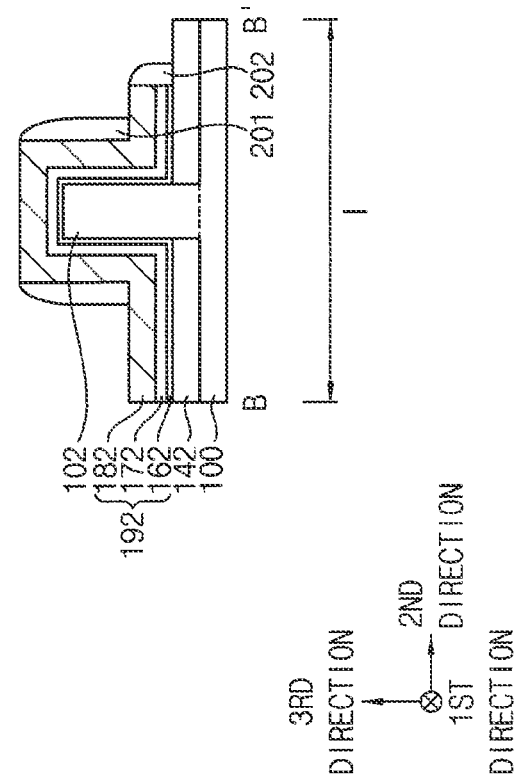

FIG. 35
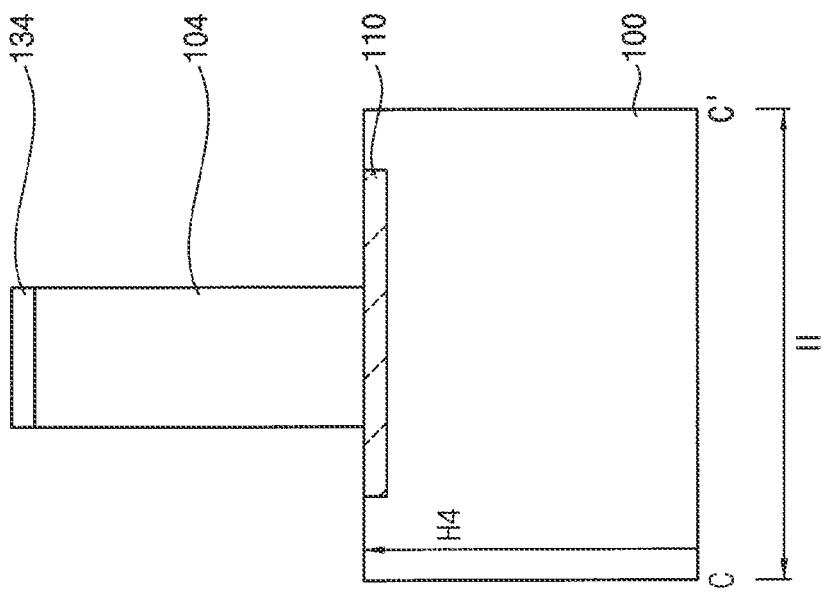
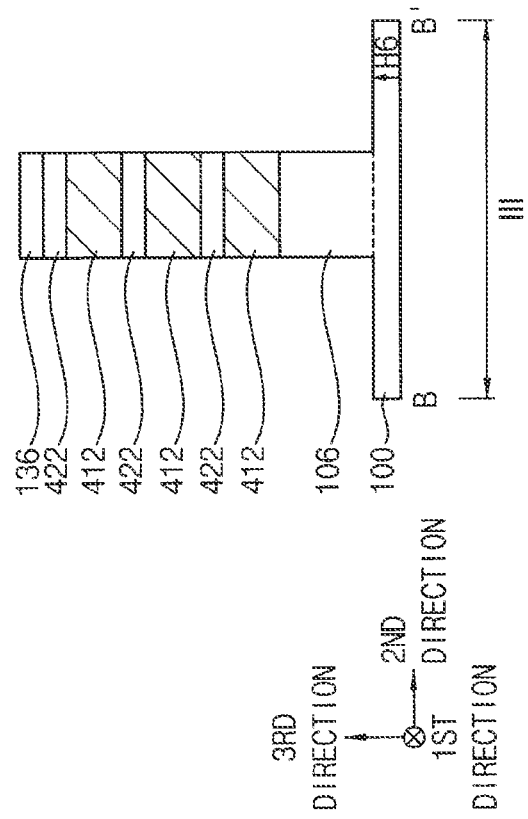

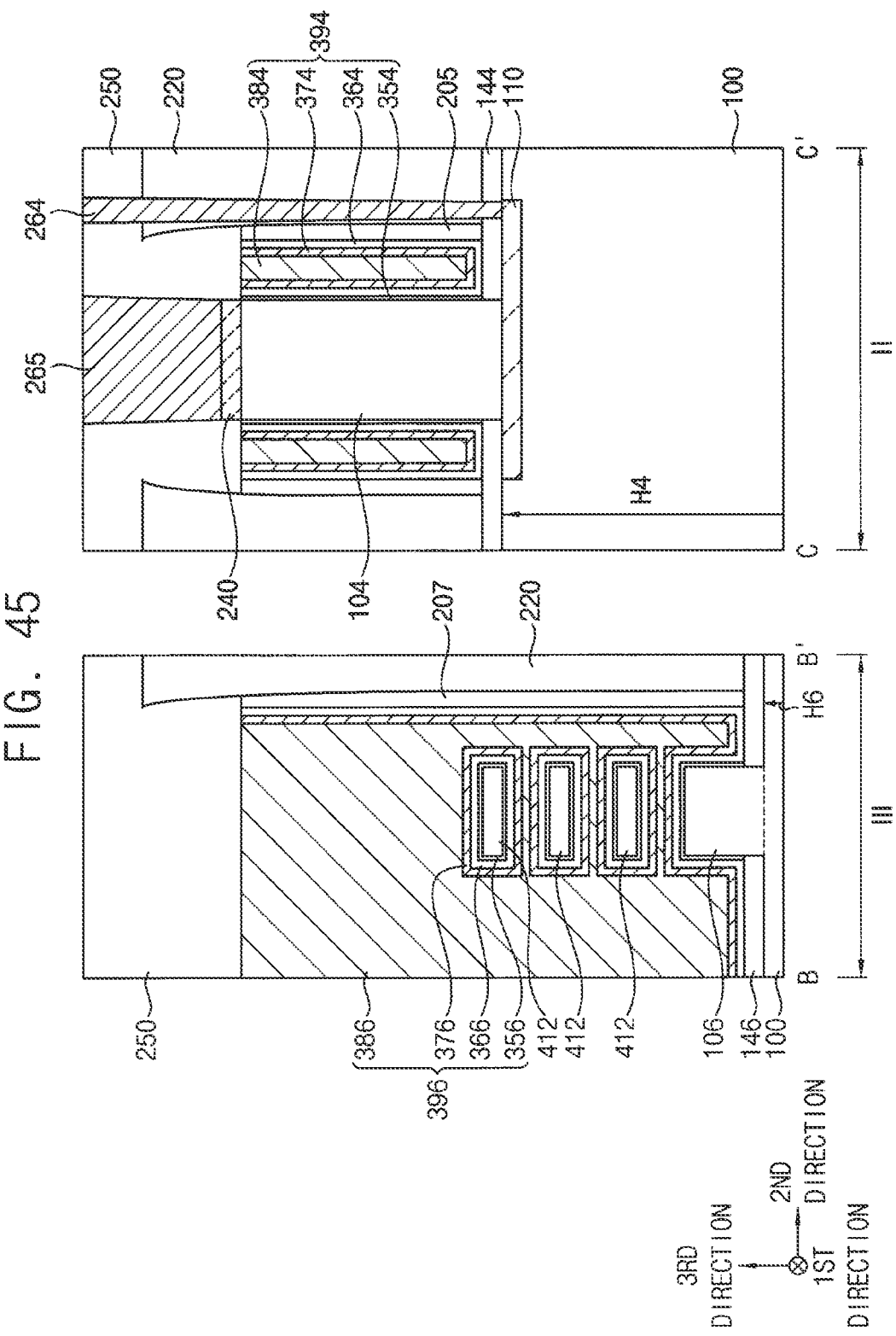

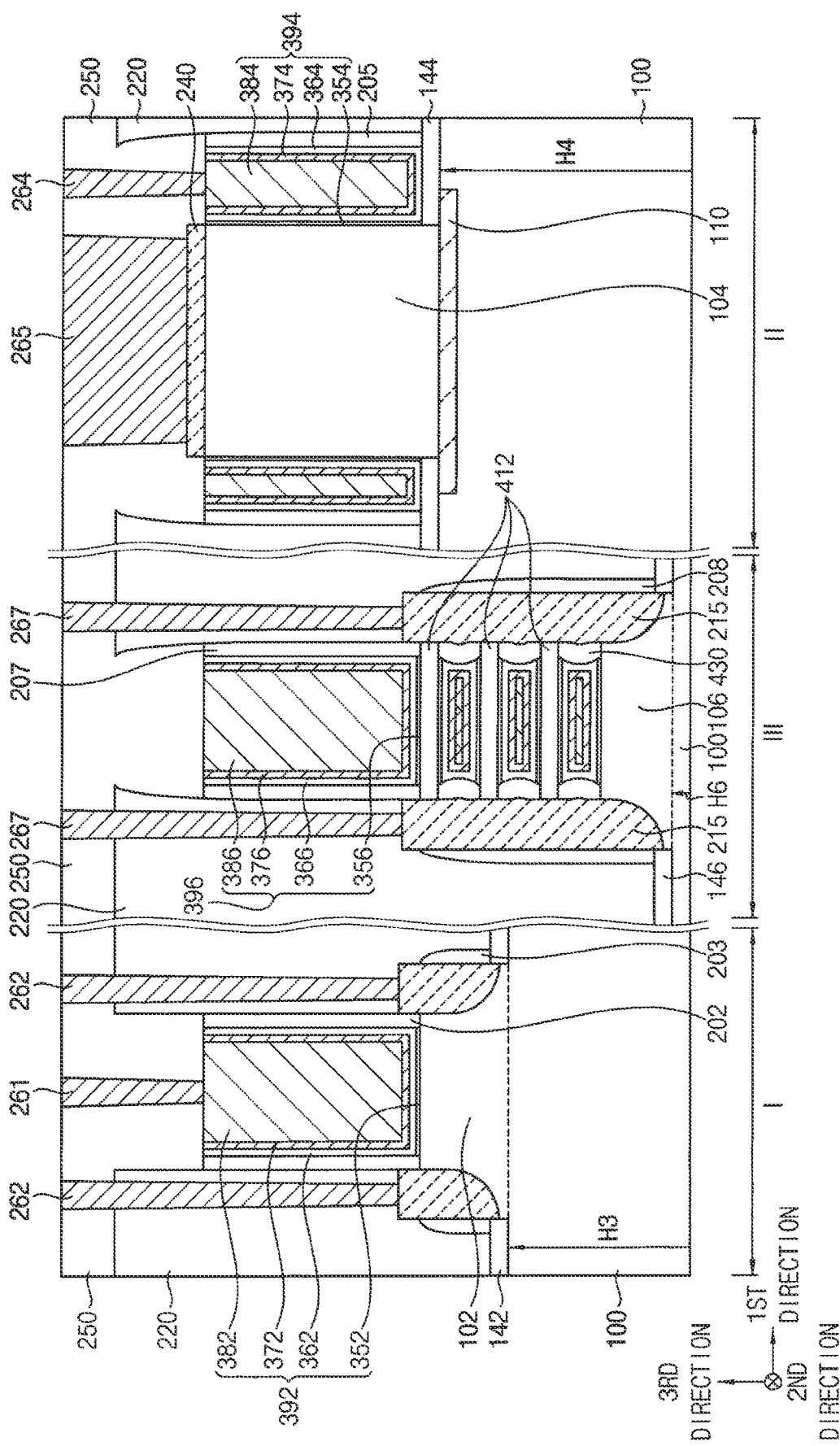

SEMICONDUCTOR DEVICES

CROSS-REFERENCE TO RELATED APPLICATION

This application is a continuation of U.S. application Ser. No. 17/019,767, filed Sep. 14, 2020, which claims priority to Korean Patent Application No. 10-2019-0169763, filed on Dec. 18, 2019, in the Korean Intellectual Property Office, and entitled: "Semiconductor Devices." Each of these is incorporated by reference herein in its entirety.

BACKGROUND

1. Field

Embodiments relate to a semiconductor device.

2. Description of the Related Art

When a finFET and a vFET are formed on the same substrate, a gate of the vFET may expose an upper portion of a semiconductor pattern. An insulating interlayer covering the finFET and the vFET may be etched to expose a hard mask on the semiconductor pattern, and the gate may be etched.

SUMMARY

The embodiments may be realized by providing a semiconductor device including a substrate including a first region and a second region, a first transistor on the first region of the substrate, the first transistor including a first semiconductor pattern protruding from an upper surface of the first region of the substrate in a vertical direction; a first gate structure covering an upper surface and a sidewall of the first semiconductor pattern; and first source/drain layers on respective portions of the first semiconductor pattern at opposite sides of the first gate structure, upper surfaces of the first source/drain layers being closer to the substrate in the vertical direction than an uppermost surface of the first gate structure is to the substrate in the vertical direction; and a second transistor on the second region of the substrate, the second transistor including a second semiconductor pattern protruding from an upper surface of the second region of the substrate in the vertical direction; a second gate structure covering a sidewall of the second semiconductor pattern; a second source/drain layer under the second semiconductor pattern at an upper portion of the second region of the substrate; and a third source/drain layer on the second semiconductor pattern, wherein the upper surface of the first region of the substrate is lower than the upper surface of the second region of the substrate.

The embodiments may be realized by providing a semiconductor device including a substrate including a first region and a second region; a first transistor on the first region of the substrate, the first transistor including a first semiconductor pattern protruding from an upper surface of the first region of the substrate in a vertical direction and extending lengthwise in a first direction parallel to an upper surface of the substrate; a first gate structure on the first semiconductor pattern, the first gate structure extending lengthwise in a second direction parallel to the upper surface of the substrate and crossing the first direction; second semiconductor patterns spaced apart from each other in the vertical direction, each of the second semiconductor patterns extending lengthwise through the first gate structure in the first direction; and first source/drain layers on respective portions of the first semiconductor pattern at opposite sides of the first gate structure in the first direction; and a second transistor on the second region of the substrate, the second transistor including a third semiconductor pattern protruding from an upper surface of the second region of the substrate in the vertical direction; a second gate structure covering a sidewall of the third semiconductor pattern; a second source/drain layer under the third semiconductor pattern at an upper portion of the second region of the substrate; and a third source/drain layer on the third semiconductor pattern, wherein the upper surface of the first region of the substrate is lower than the upper surface of the second region of the substrate.

The embodiments may be realized by providing a semiconductor device including a substrate including a first region, a second region, and a third region; a first transistor on the first region of the substrate, the first transistor including a first semiconductor pattern protruding from an upper surface of the first region of the substrate in a vertical direction and extending lengthwise in a first direction parallel to an upper surface of the substrate; a first gate structure covering an upper surface and a sidewall of the first semiconductor pattern in a second direction parallel to the upper surface of the substrate and crossing the first direction; and first source/drain layers on respective portions of the first semiconductor pattern at opposite sides of the first gate structure in the first direction; a second transistor on the second region of the substrate, the second transistor including a second semiconductor pattern protruding from an upper surface of the second region of the substrate in the vertical direction and extending lengthwise in the first direction; a second gate structure surrounding a sidewall of the second semiconductor pattern; a second source/drain layer under the second semiconductor pattern at an upper portion of the second region of the substrate; and a third source/drain layer on the second semiconductor pattern; and a third transistor on the third region of the substrate, the third transistor including a third semiconductor pattern protruding from an upper surface of the third region of the substrate in the vertical direction and extending lengthwise in the first direction; a third gate structure on the third semiconductor pattern; fourth semiconductor patterns spaced apart from each other in the vertical direction, each of the fourth semiconductor patterns extending lengthwise through the third gate structure in the first direction; and fourth source/drain layers on respective portions of the third semiconductor pattern at opposite sides of the third gate structure in the first direction, wherein the upper surface of the first region of the substrate is lower than the upper surface of the second region of the substrate, and the upper surface of the third region of the substrate is lower than the upper surface of the first region of the substrate.

BRIEF DESCRIPTION OF THE DRAWINGS

Features will be apparent to those of skill in the art by describing in detail exemplary embodiments with reference to the attached drawings in which:

FIGS. 1 to 21 are plan views and cross-sectional views of stages in a method of manufacturing a semiconductor device in accordance with example embodiments.

FIGS. 32 to 45 are plan views and cross-sectional views of stages in a method of manufacturing a semiconductor device in accordance with example embodiments.

FIG. 46 is a cross-sectional view of a semiconductor device in accordance with example embodiments.

DETAILED DESCRIPTION

Hereinafter in the specifications (not necessarily in the claims), two directions substantially parallel to an upper surface of a substrate and crossing each other may be defined as first and second directions, respectively, and a direction substantially perpendicular to the upper surface of the substrate may be defined as a third direction or vertical direction. In example embodiments, the first and second directions may be substantially perpendicular to each other.

FIGS. 1 to 21 are plan views and cross-sectional views of stages in a method of manufacturing a semiconductor device in accordance with example embodiments. Particularly, FIGS. 1, 3, 8, 11 and 19 are the plan views, FIGS. 2, 4, 6-7, 9, 12, 14, 16 and 20 are cross-sectional views taken along lines A-A' of corresponding plan views, respectively, and FIGS. 5, 10, 13, 15, 17-18 and 21 are cross-sectional views taken along lines B-B' and C-C' of corresponding plan views, respectively.

Figure 1:
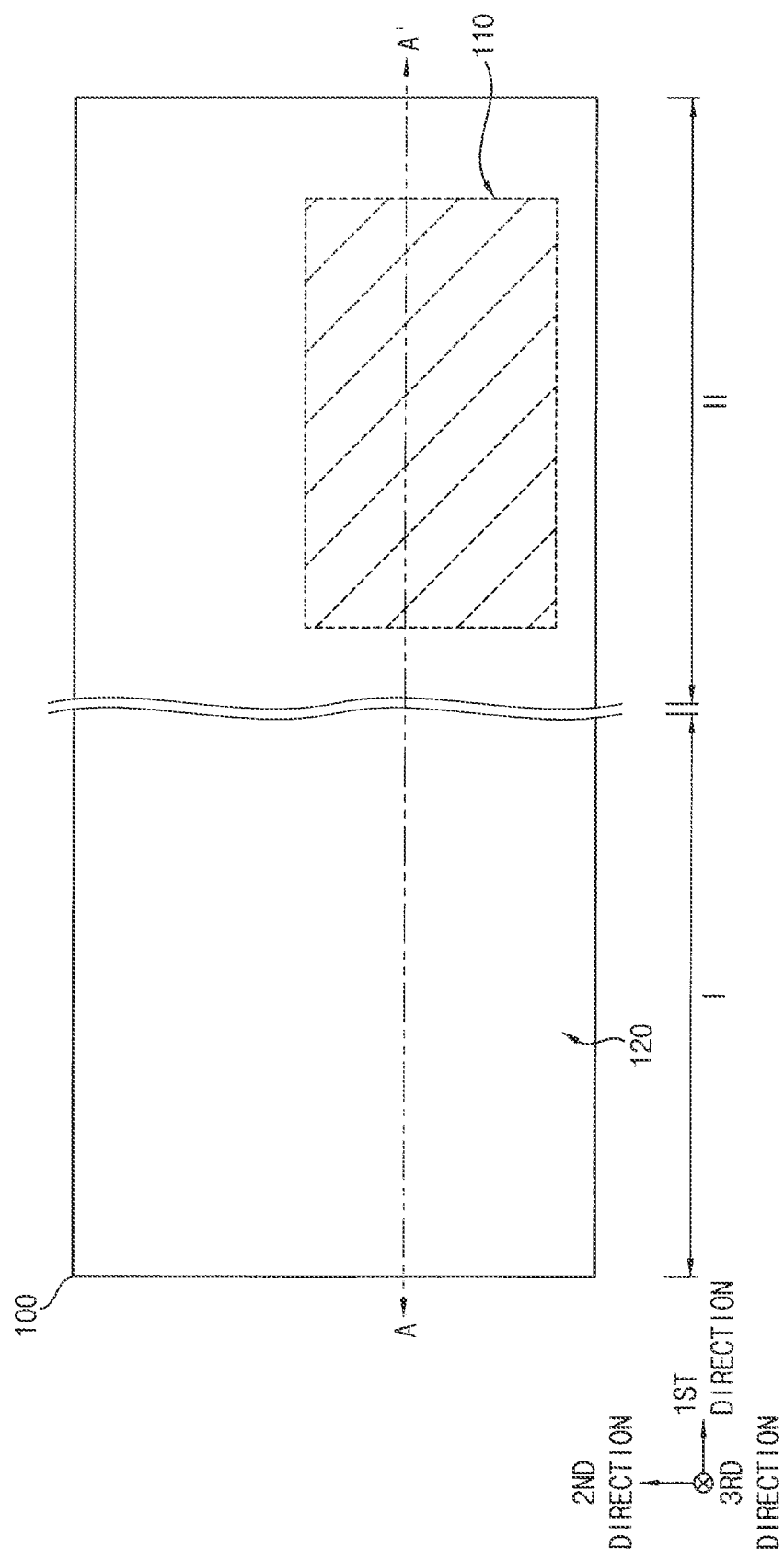
Figure 2:
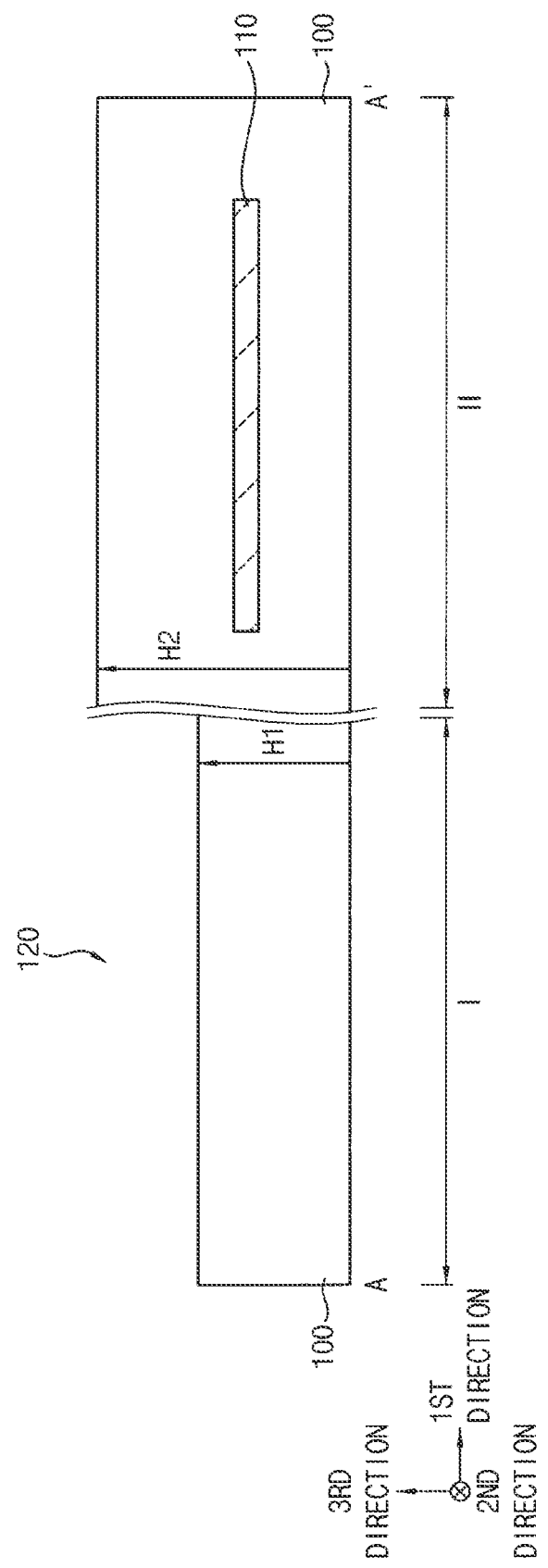

Referring to FIGS. 1 and 2, a first impurity region 110 may be formed at a portion of a second region II of a substrate 100 (including a first region I and the second region II). An upper portion of the first region I of the substrate 100 may be removed to form a first recess 120.

The substrate 100 may include a semiconductor material, e.g., silicon, germanium, silicon-germanium, etc., or III-V semiconductor compounds, e.g., GaP, GaAs, GaSb, etc. In an implementation, the substrate 100 may be a silicon-on-insulator (SOI) substrate, or a germanium-on-insulator (GOI) substrate.

The first impurity region 110 may be formed by implanting impurities onto the substrate 100 by, e.g., an ion implantation process, and the impurities may include, e.g., n-type impurities or p-type impurities. In an implementation, as illustrated in the drawings, the first impurity region 110 may extend lengthwise in the first direction in the second region II of the substrate 100. In an implementation, the first impurity region 110 may be formed in an entire portion of the second region II of the substrate 100, or a plurality of first impurity regions 110 may be formed to be spaced apart from each other in the second direction.

As the first recess 120 is formed on the first region I of the substrate 100, an upper surface of the first region I of the substrate 100 may have a first height H1 (e.g., in the third or vertical direction) less than a second height H2 of an upper surface of the second region II of the substrate 100.

Figure 3:
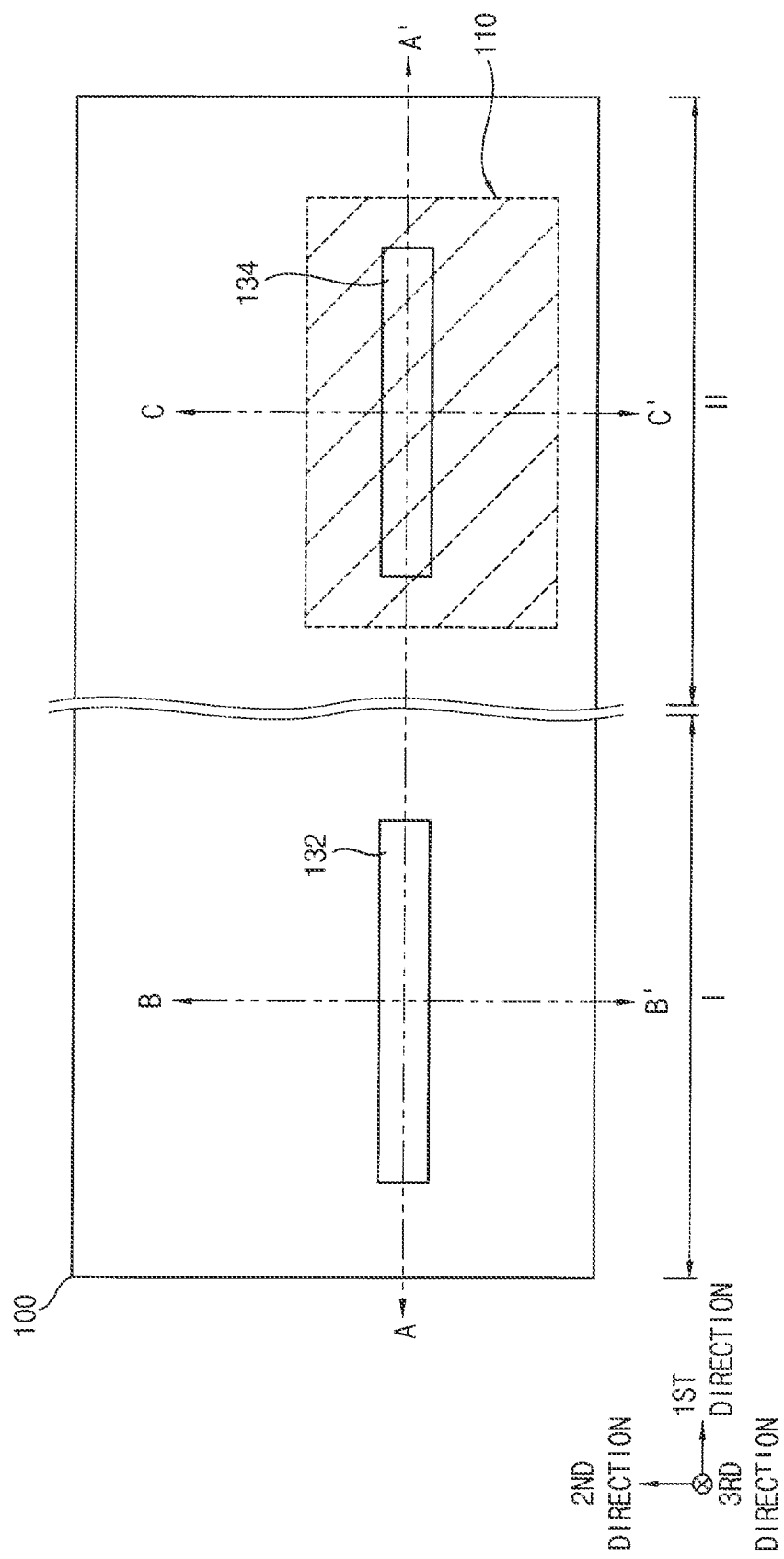
Figure 4:
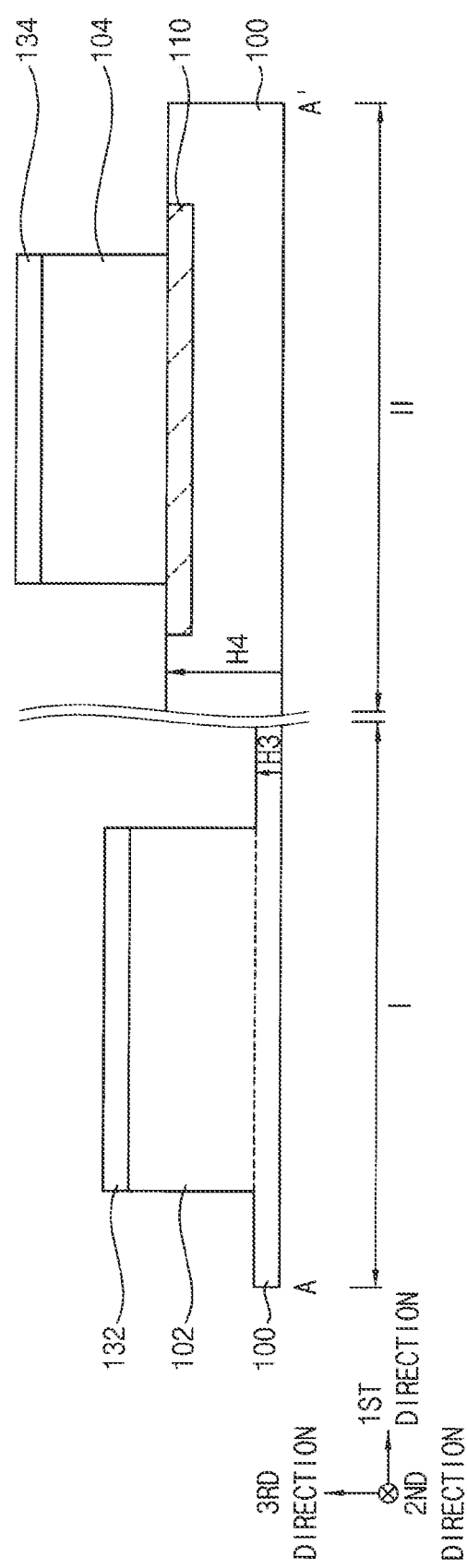

Referring to FIGS. 3 to 5, first and second hard masks 132 and 134 may be formed on the first and second regions I and II, respectively, of the substrate 100, and upper portions of the substrate 100 may be etched using the first and second hard masks 132 and 134 as an etching mask to form first and second semiconductor patterns 102 and 104 protruding from the substrate 100 upwardly in the third direction on the first and second regions I and II, respectively, of the substrate 100. A portion of an upper surface of the first impurity region 110 on the second region II of the substrate 100 may be exposed.

In an implementation, each of the first and second hard masks 132 and 134 may extend (e.g., lengthwise) in the first direction. In an implementation, the second hard mask 134 may overlap the first impurity region 110 in a plan view. In an implementation, as illustrated in the drawings, one first hard mask 132 and one second hard mask 134 may be on the first and second regions I and II, respectively, of the substrate 100. In an implementation, a plurality of first hard masks 132 may be formed to be spaced apart from each other in the second direction and/or in the first direction on the first region I of the substrate 100, and a plurality of second hard masks 134 may be formed to be spaced apart from each other in the second direction and/or in the first direction on the second region II of the substrate 100. In an implementation, a plurality of first semiconductor patterns 102 may be formed to be spaced apart from each other on the first region I of the substrate 100, and a plurality of second semiconductor patterns 104 may be formed to be spaced apart from each other on the second region II of the substrate 100.

Each of the first and second hard masks 132 and 134 may include a nitride, e.g., silicon nitride.

As the first and second semiconductor patterns 102 and 104 are formed, upper surfaces of the first and second regions I and II of the substrate 100 (on or at which the first and second semiconductor patterns 102 and 104 are not formed) may have third and fourth heights H3 and H4 (in the vertical direction), respectively, and the third height H3 may be less than the fourth height H4. In an implementation, a thickness of the first region I of the substrate 100 in the third direction (e.g., corresponding with H3) may be less than a thickness of the second region II of the substrate 100 in the third direction (e.g., corresponding with H4).

Figure 6:
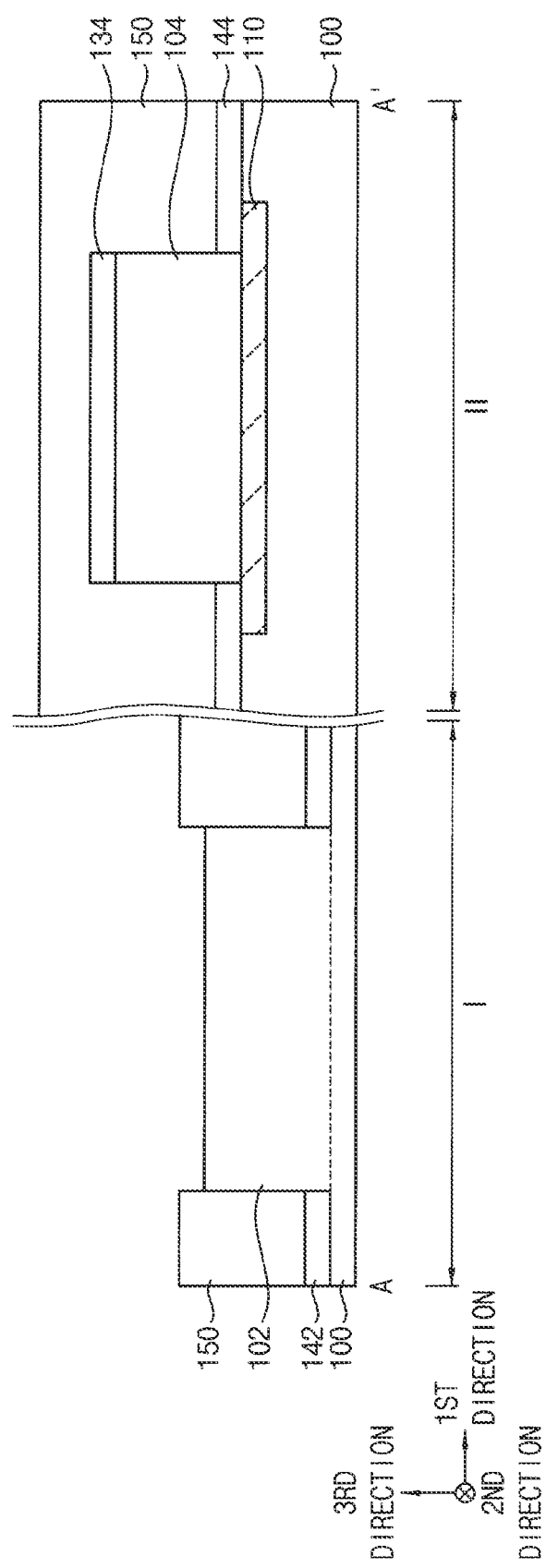

Referring to FIG. 6, a first spacer layer may be formed on the substrate 100 having the first and second semiconductor patterns 102 and 104 and the first and second hard masks 132 and 134, and an upper portion of the first spacer layer may be etched to form first and second spacers 142 and 144 covering lower sidewalls of the first and second semiconductor patterns 102 and 104, respectively.

The first and second spacers 142 and 144 may include an oxide, e.g., silicon oxide.

A first sacrificial layer 150 may be formed to cover the first and second semiconductor patterns 102 and 104 and the first and second hard masks 132 and 134. A portion of the first sacrificial layer 150 on the first region I of the substrate 100 may expose an upper surface of the first hard mask 132.

The first sacrificial layer 150 may include, e.g., silicon-on-hardmask (SOH), amorphous carbon layer (ACL), or the like. The exposed first hard mask 132 may be removed to expose an upper surface of the first semiconductor pattern 102, and the first sacrificial layer 150 may be removed.

Figure 7:
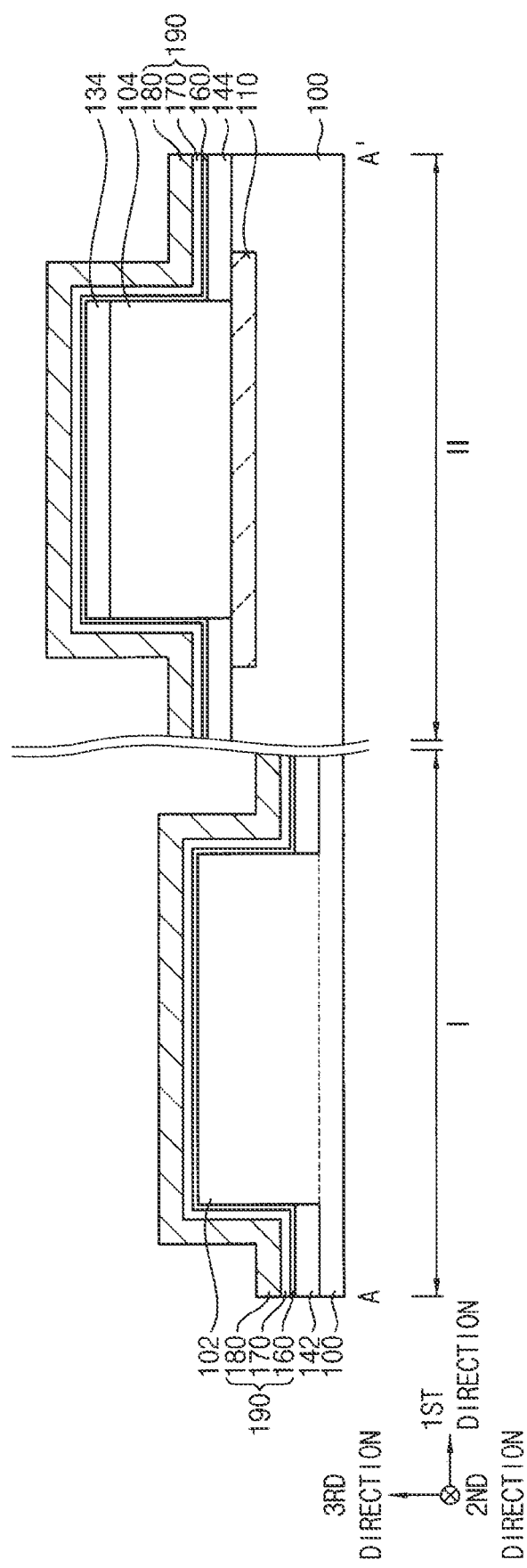

Referring to FIG. 7, a gate structure layer may be conformally formed on the first and second spacers 142 and 144, the first and second semiconductor patterns 102 and 104, and the second hard mask 134.

In an implementation, the gate structure layer 190 may include an interface layer 160, a gate insulation layer 170, and a gate electrode layer 180 sequentially stacked. The interface layer 160, the gate insulation layer 170 and the gate electrode layer 180 may include, e.g., silicon oxide, a metal oxide, and a metal, respectively.

Figure 8:
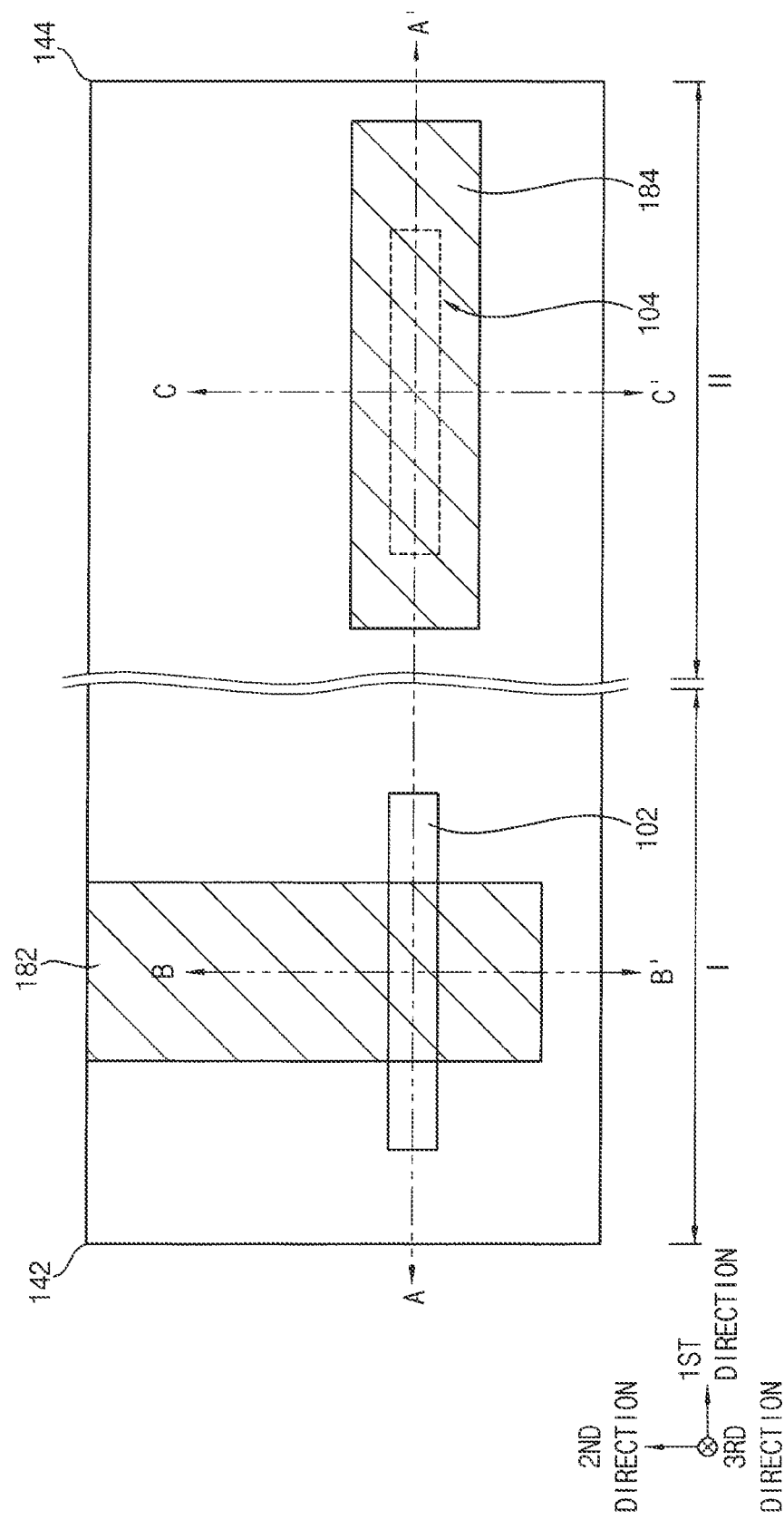
Figure 9:
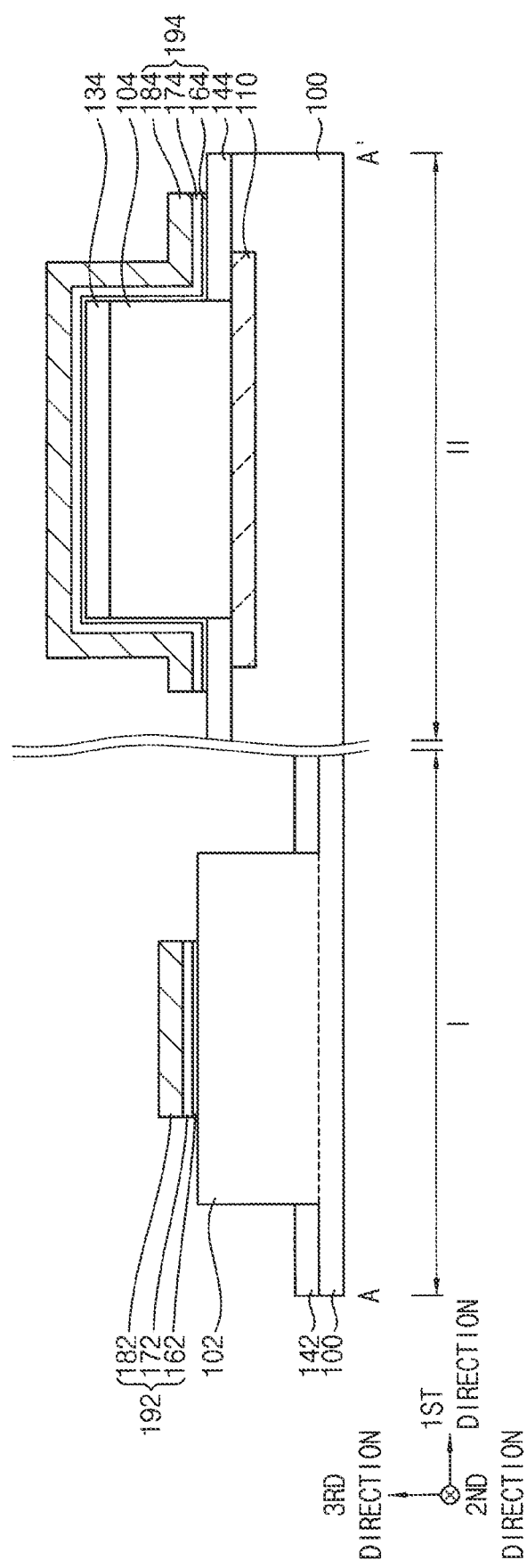
Figure 10:
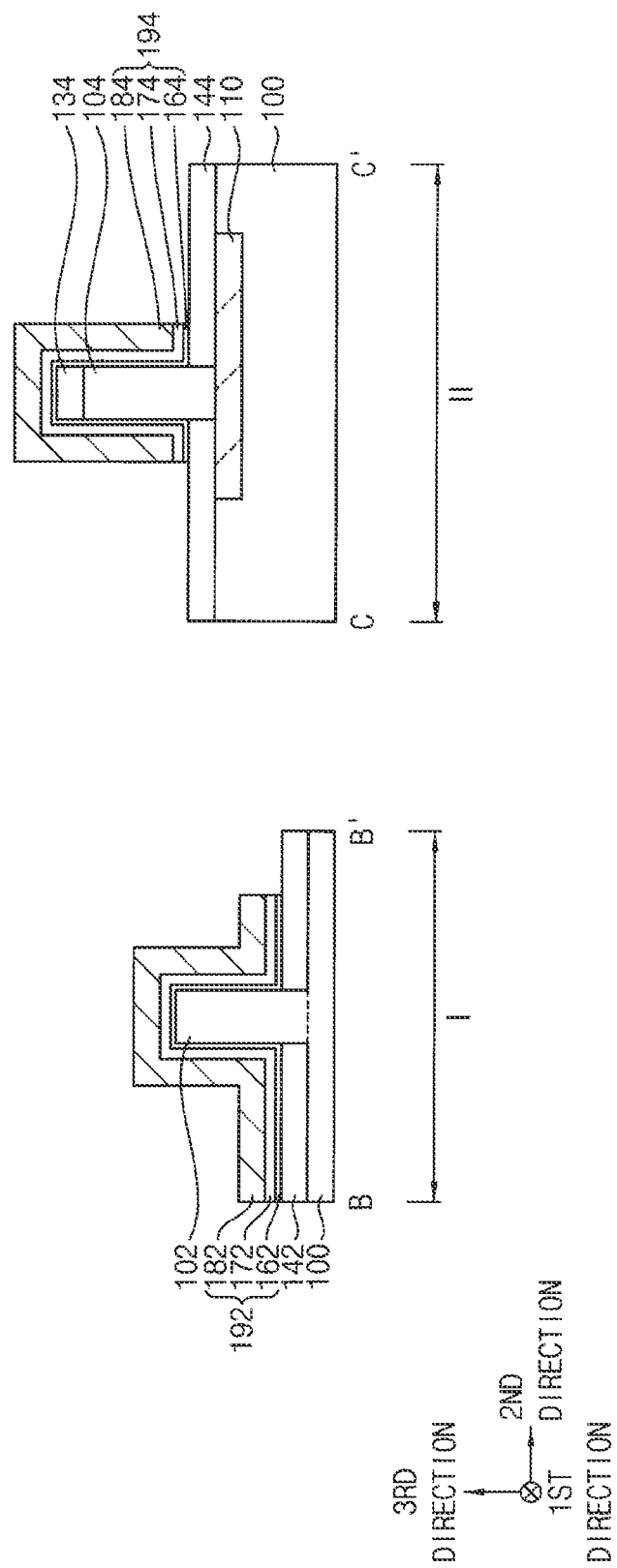

Referring to FIGS. 8 to 10, the gate structure layer 190 may be etched by an etching process using an etching mask to form first and second gate structures 192 and 194 on the first and second regions I and II, respectively, of the substrate 100.

In an implementation, the first gate structure 192 may extend in the second direction, and may cover a portion of the first semiconductor pattern 102, e.g., a central portion in the first direction. When a plurality of first semiconductor patterns 102 is formed to be spaced apart from each other in the second direction, the first gate structure 192 may cover one or ones of the plurality of first semiconductor patterns 102. In an implementation, as illustrated in the drawings, one first gate structure 192 may be used. In an implementation, a plurality of first gate structures 192 may be formed to be spaced apart from each other in the first direction, and each of the plurality of first gate structures 192 may cover a portion of each of the first semiconductor patterns 102. The first gate structure 192 may include a first interface pattern 162, a first gate insulation pattern 172, and a first gate electrode 182 sequentially stacked.

The second gate structure 194 may extend in the first direction, and may entirely cover the second semiconductor pattern 104. The second gate structure 194 may have an area greater than that of the second semiconductor pattern 104 in a plan view. When a plurality of second semiconductor patterns 104 is formed to be spaced apart from each other in the second direction, a plurality of second gate structures 194 may be formed to be spaced apart from each other in the second direction to cover the second semiconductor patterns 104, respectively. In an implementation, a plurality of second gate structures 194 may be formed to be spaced apart from each other in the first direction. The second gate structure 194 may include a second interface pattern 164, a second gate insulation pattern 174 and a second gate electrode 184 sequentially stacked.

Figure 11:
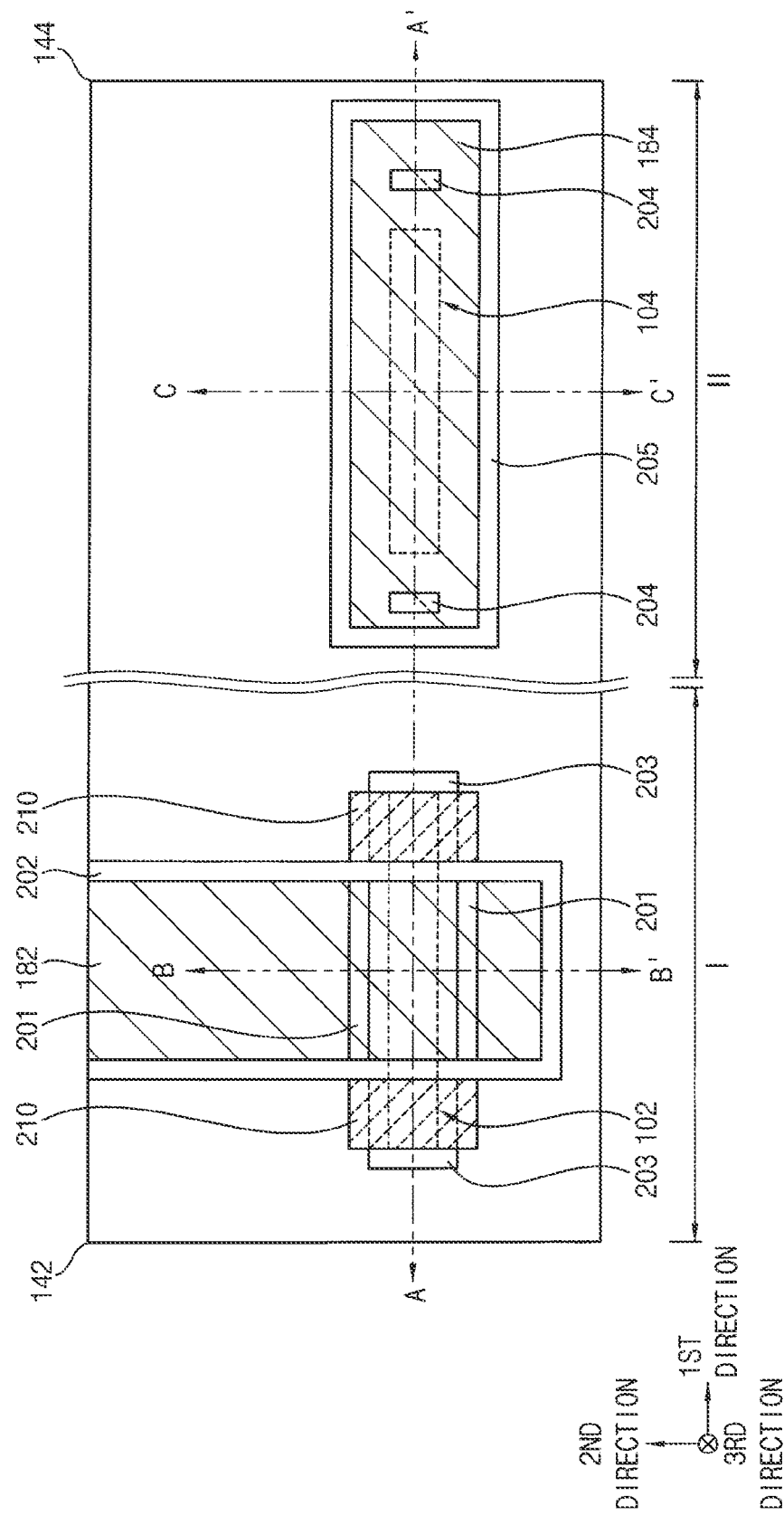
Figure 12:
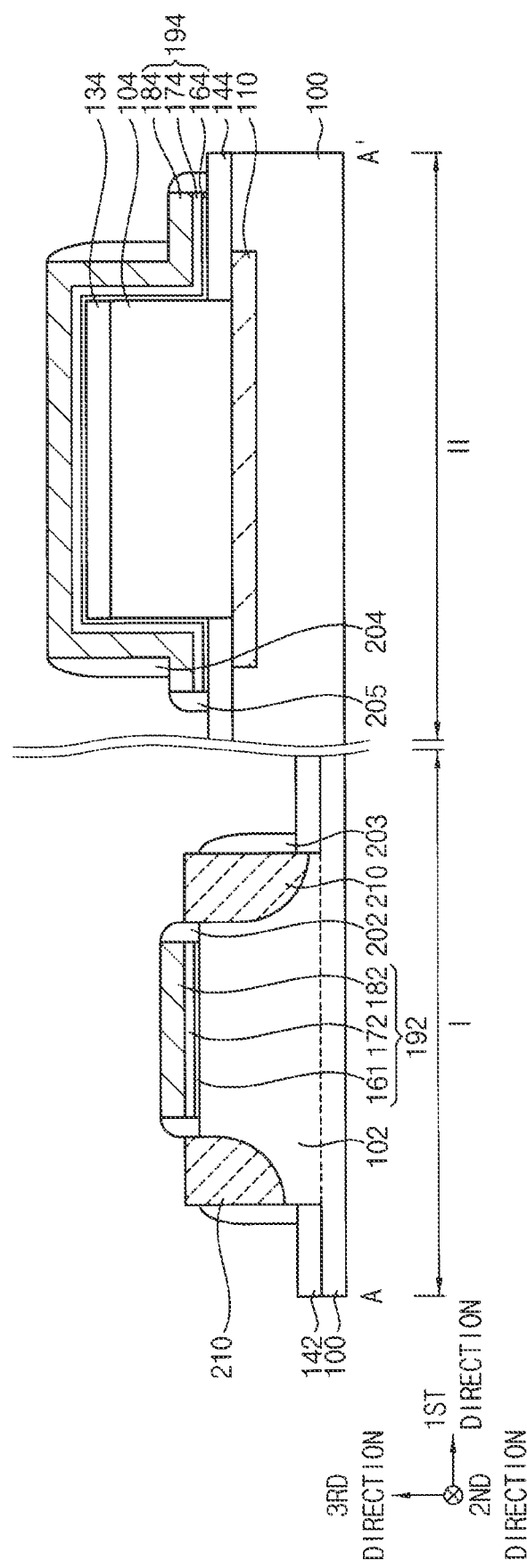

Referring to FIGS. 11 to 13, a second spacer layer may be formed on the first and second gate structures 192 and 194, the first and second spacers 142 and 144, and the first semiconductor pattern 102, and may be anisotropically etched.

A fourth spacer 202 may be formed on a sidewall of the first gate structure 192, a fifth spacer 203 may be formed on a sidewall of a portion of the first semiconductor pattern 102 (not covered by the first gate structure 192), and a seventh spacer 205 may be formed on a sidewall of the second gate structure 194.

A portion of the first gate structure 192 on the first semiconductor pattern 102 and a portion of the first gate structure 192 on the first spacer 142 may have different heights, and thus a third spacer 201 may be further formed on a portion of the first gate structure 192 on each of opposite sidewalls in the second direction of the first semiconductor pattern 102. In an implementation, a portion of the second gate structure 194 on the second semiconductor pattern 104 and a portion of the second gate structure 194 on the second spacer 144 may have different heights, and thus a sixth spacer 204 may be further formed on a portion of the second gate structure 194 on each of opposite sidewalls in the second direction of the second semiconductor pattern 104.

A portion of the first semiconductor pattern 102 not covered by the first gate structure 192 and the fourth spacer 202 may be etched to from a second recess, and a selective epitaxial growth (SEG) process may be performed using a portion of the first semiconductor pattern 102 exposed by the second recess as a seed to form a second impurity region 210 in the second recess.

In an implementation, the SEG process may be performed using a silicon source gas, a germanium source gas, an etching gas, and a carrier gas to form a single crystalline silicon-germanium layer. The SEG process may be performed using a p-type impurity source gas, and a silicon-germanium layer doped with p-type impurities.

In an implementation, the SEG process may be performed using a silicon source gas, a carbon source gas, an etching gas, and a carrier gas to form a single crystalline silicon carbide layer. The SEG process may be performed using an n-type impurity source gas, and a single crystalline silicon carbide layer doped with n-type impurities. In an implementation, the SEG process may be performed using a silicon source gas, an etching gas, and a carrier gas to form a single crystalline silicon layer. The SEG process may be performed using an n-type impurity source gas, and a single crystalline silicon layer doped with n-type impurities.

The second impurity region 210 may grow not only in a vertical direction but also in a horizontal direction, and may contact a sidewall of the fourth spacer 202. In an implementation, the second impurity region 210 may have a cross-section taken along the second direction having a polygon-like shape, e.g., a pentagon-like shape.

Figure 14:
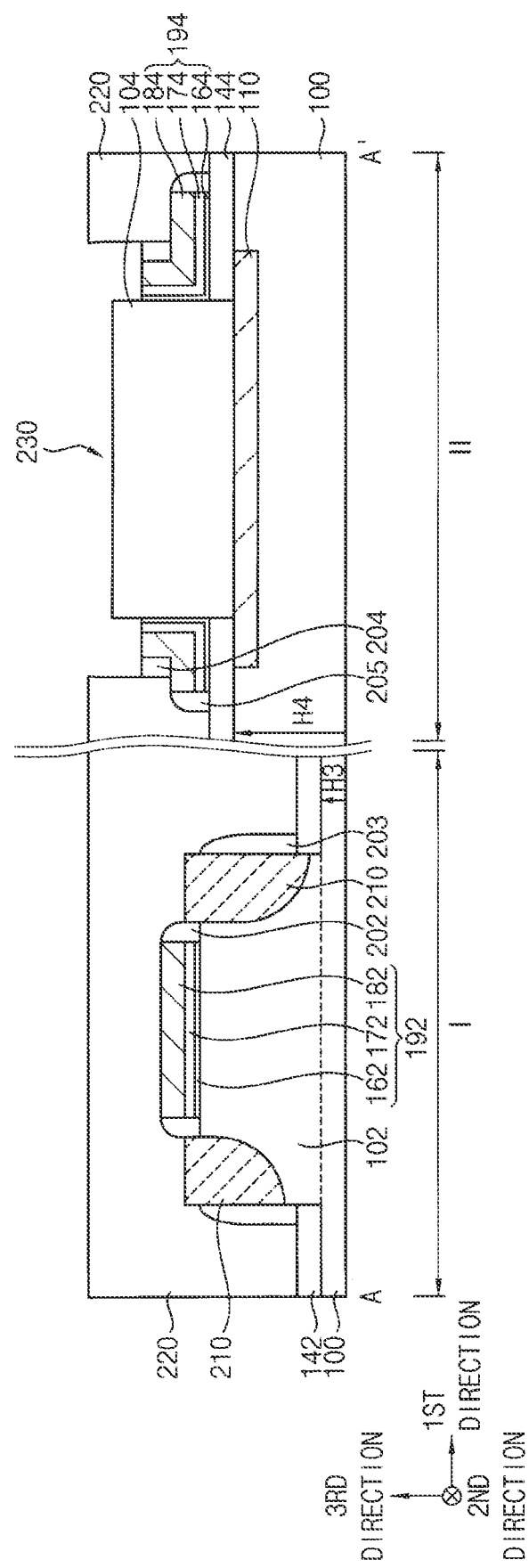
Figure 15:
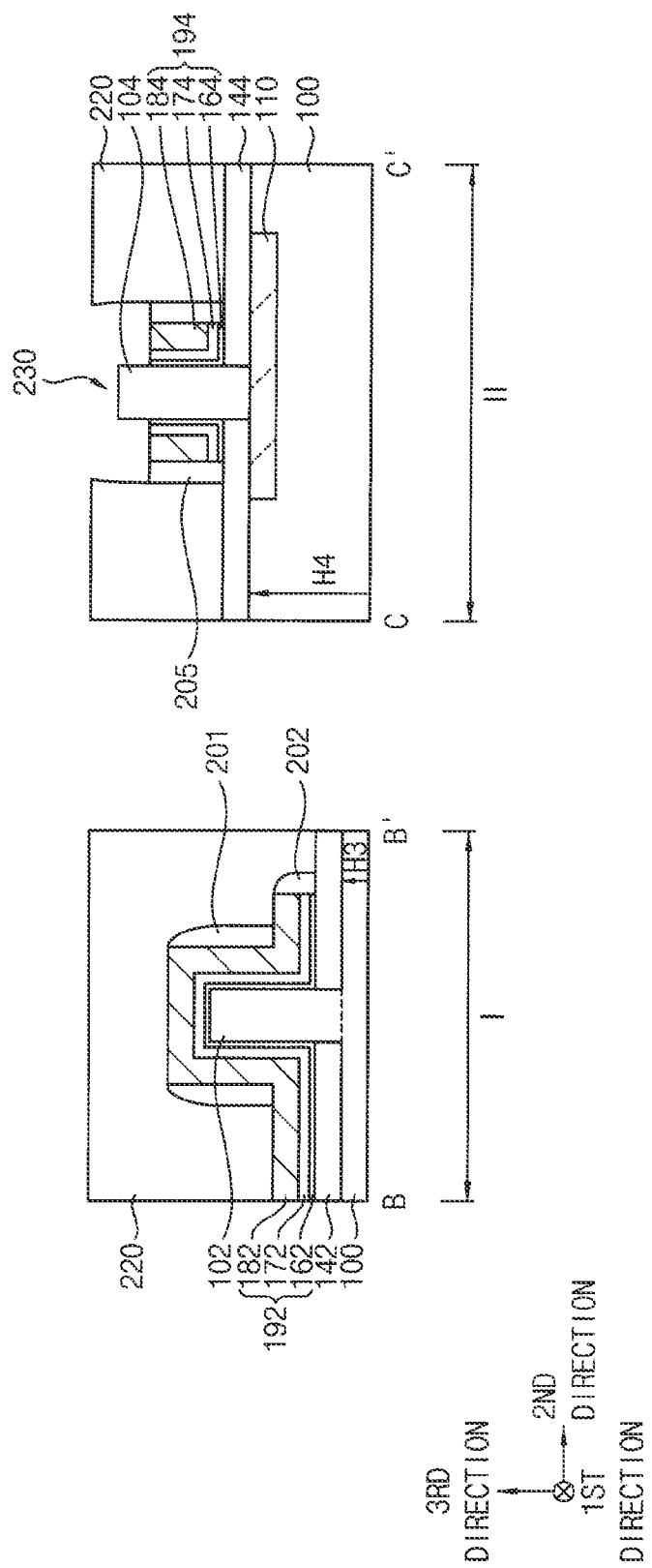

Referring to FIGS. 14 and 15, a first insulating interlayer 220 may be formed on the first and second spacers 142 and 144 to cover the first and second gate structures 192 and 194, the third to seventh spacers 201, 202, 203, 204 and 205, and the second impurity region 210, and may be planarized until an upper surface of the second hard mask 134 is exposed.

In an implementation, the planarization process may be performed by a chemical mechanical polishing (CMP) process. As described above, the third height H3 of the upper surface of the first region I of the substrate 100 may be less than the fourth height H4 of the second region II of the substrate 100, and during the planarization process, an upper surface of the first gate structure 192 on the first region I of the substrate 100 may not be exposed.

In the planarization process, a portion of the second gate structure 194 on the upper surface of the second hard mask 134 may be also removed.

An upper portion of the exposed second gate structure 194, the second hard mask 134, and an upper portion of the sixth spacer 204 may be removed, and a third recess 230 exposing an upper surface of the second semiconductor pattern 104 may be formed.

Figure 16:
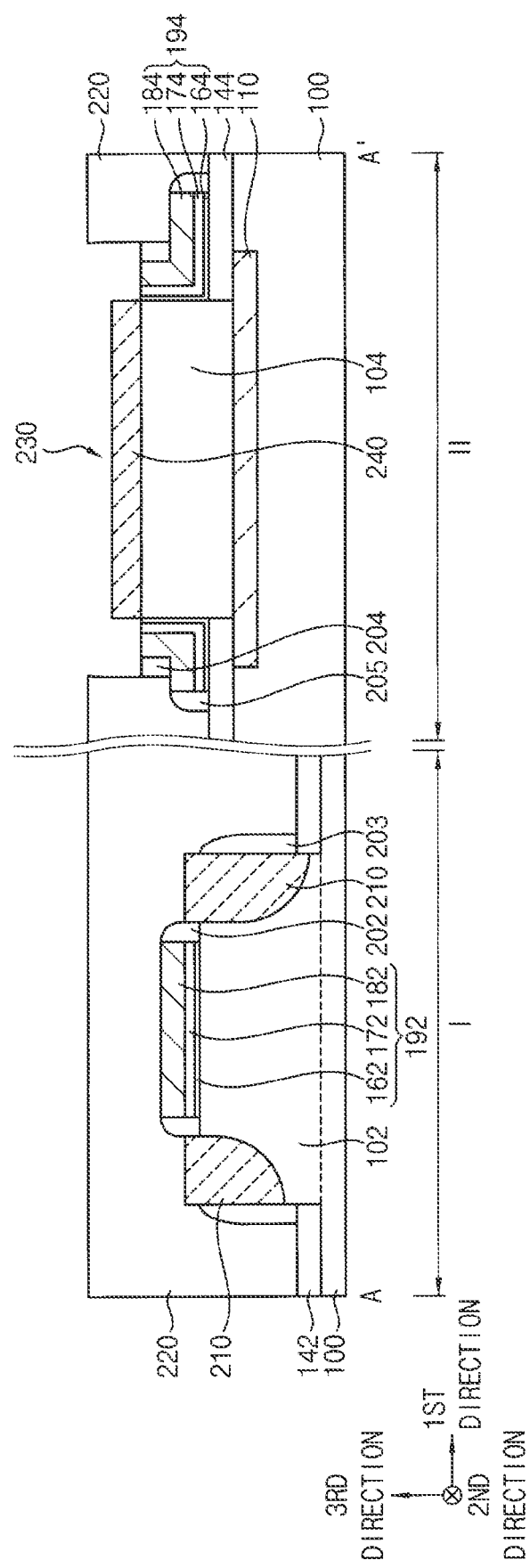
Figure 17:
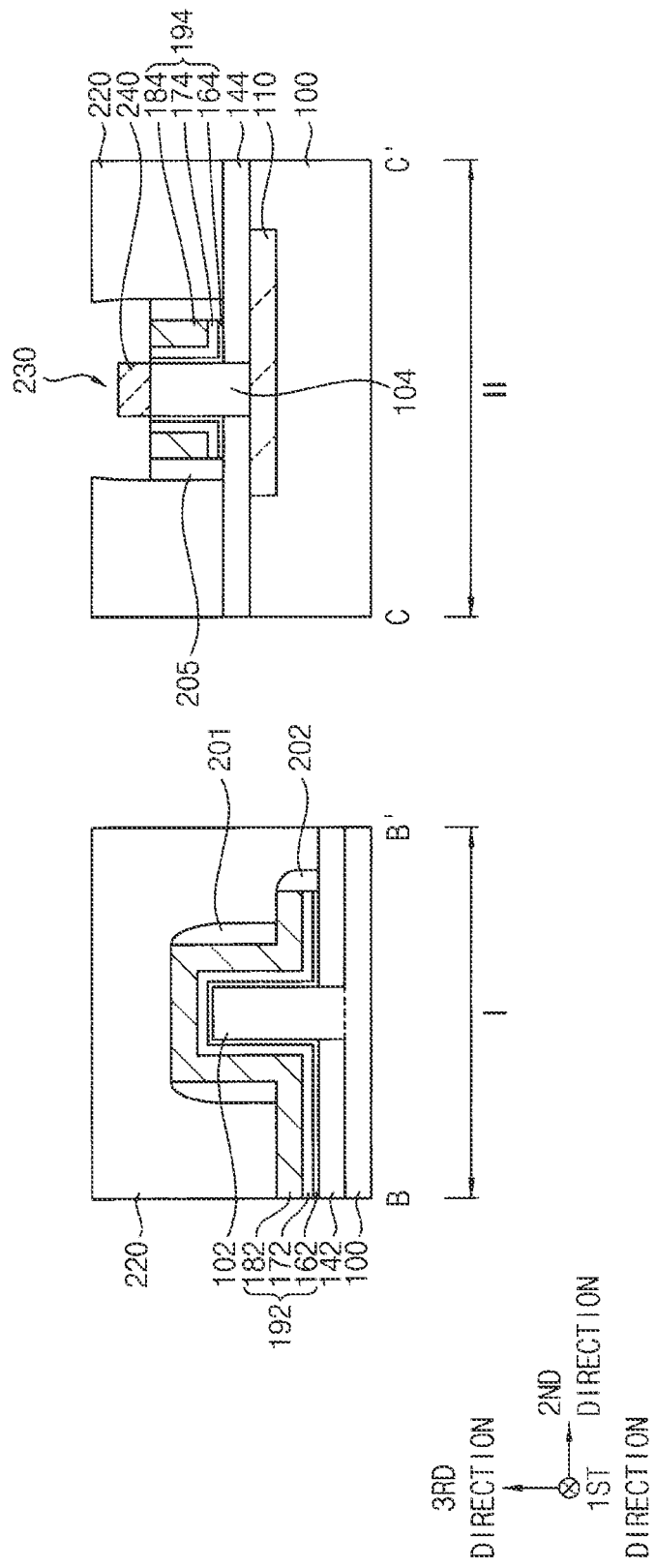

Referring to FIGS. 16 and 17, impurities may be implanted into an upper portion of the exposed second semiconductor pattern 104 by, e.g., an ion implantation process, to form a third impurity region 240. In an implementation, the third impurity region 240 may include impurities having the same conductivity type as the first impurity region 110.

Figure 18:
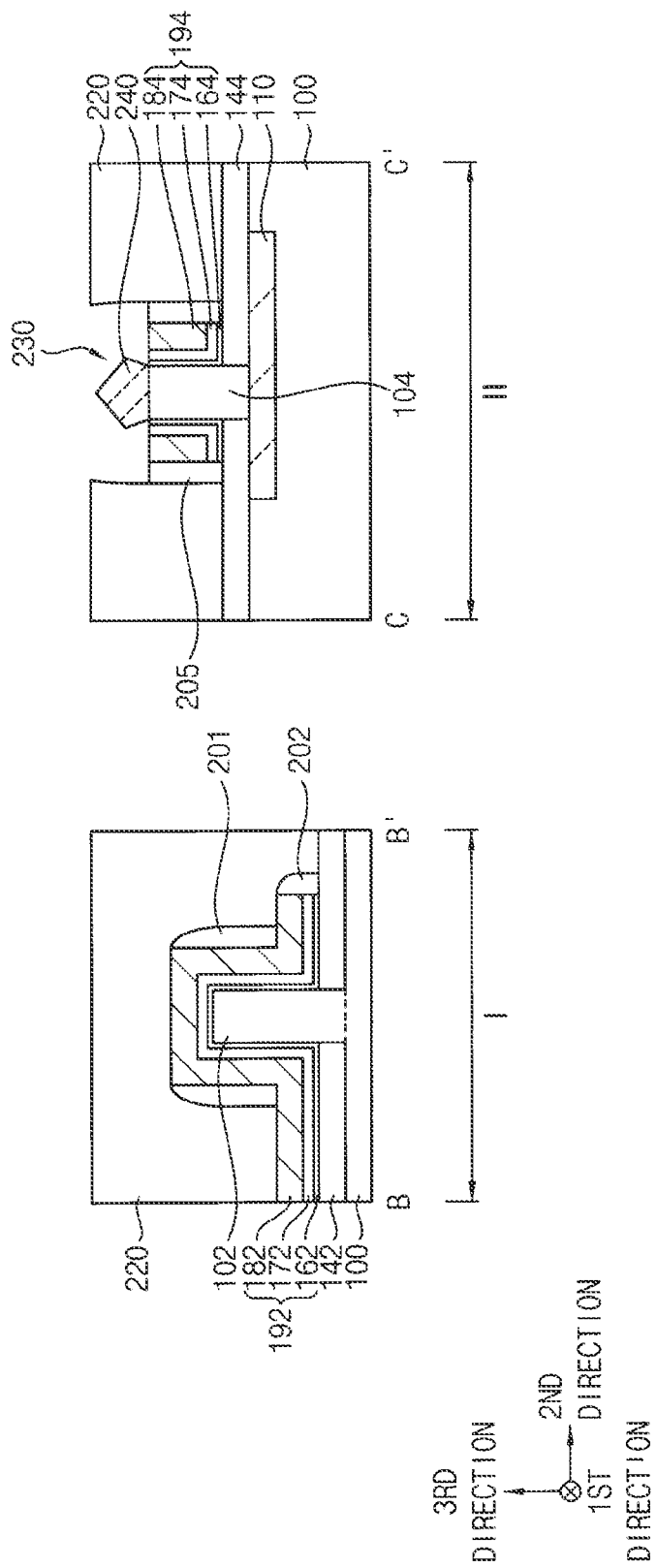

In an implementation, referring to FIG. 18, after removing the exposed upper portion of the second semiconductor pattern 104, a SEG process may be performed using the second semiconductor pattern 104 as a seed to form the third impurity region 240. In this case, the third impurity region 240 may have a cross-section taken along in the second direction having a polygon-like shape, e.g., a pentagon-like shape.

Figure 19:
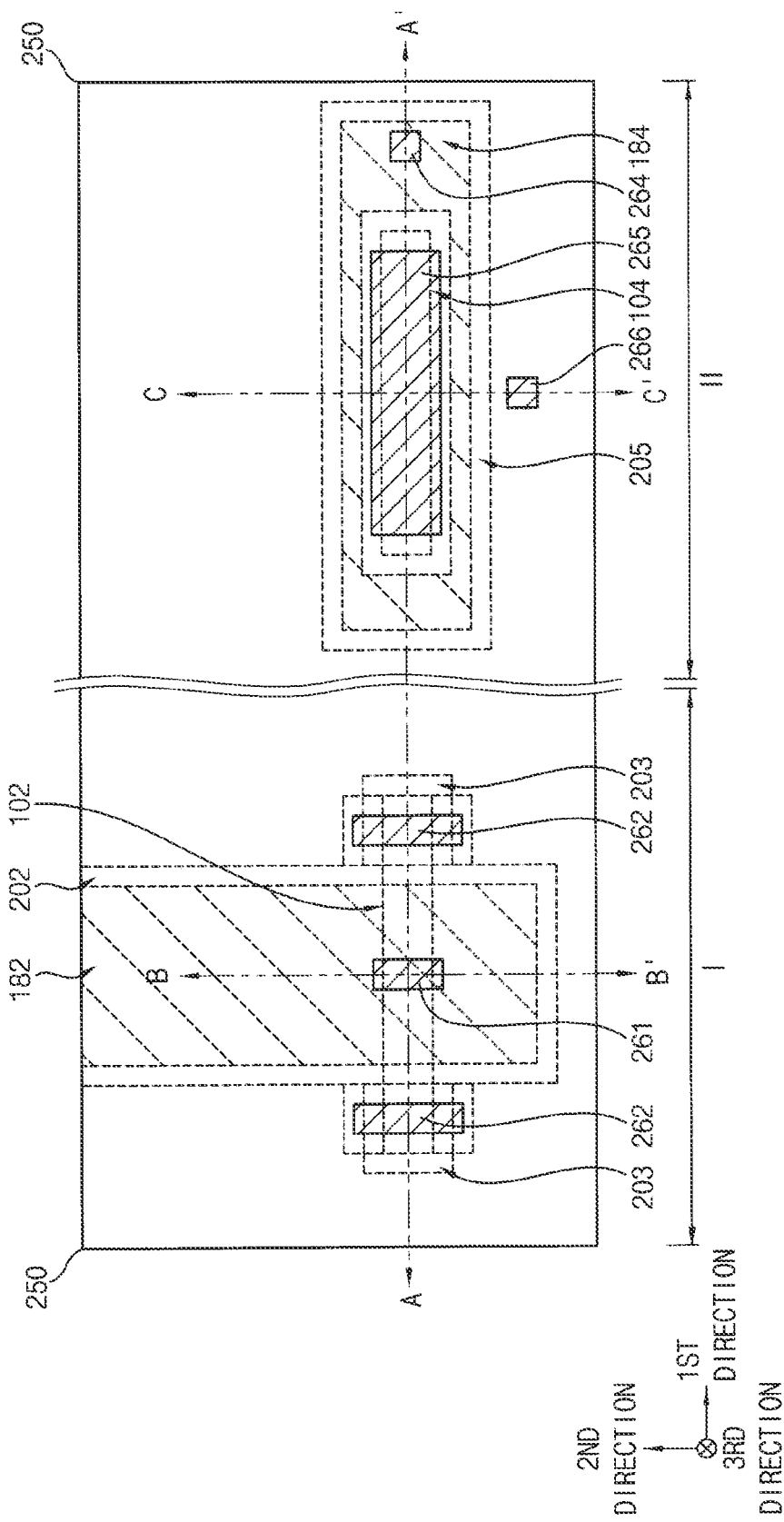
Figure 20:
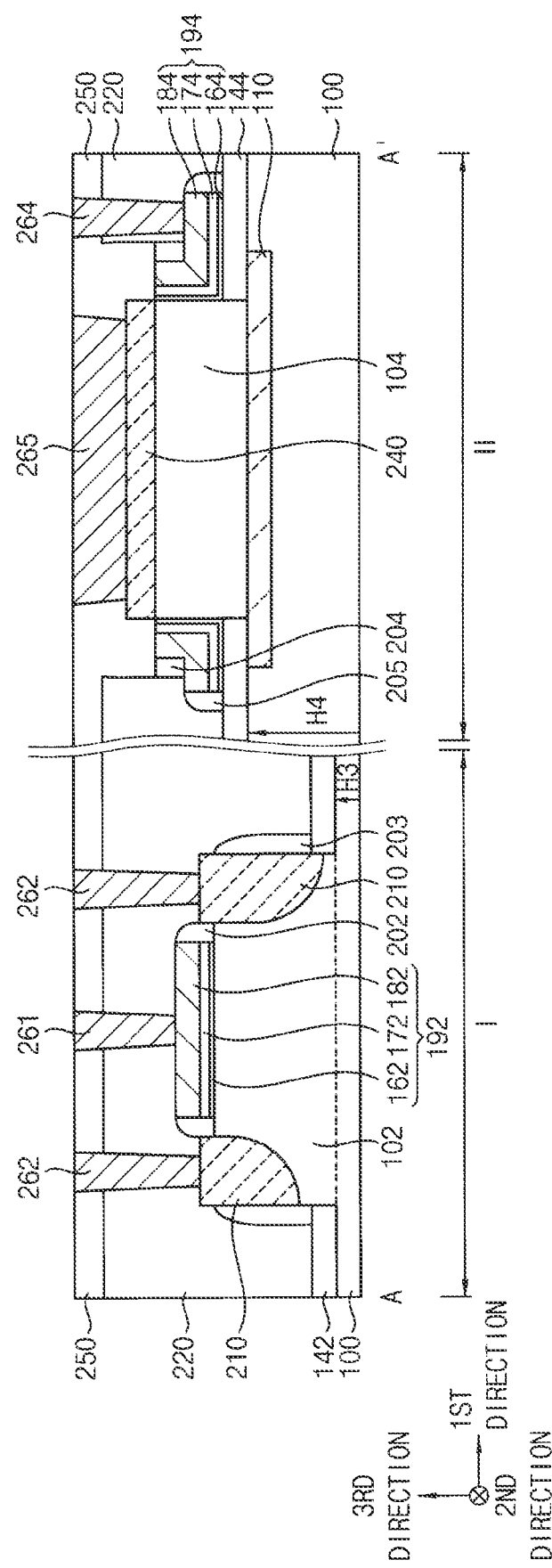
Figure 21:
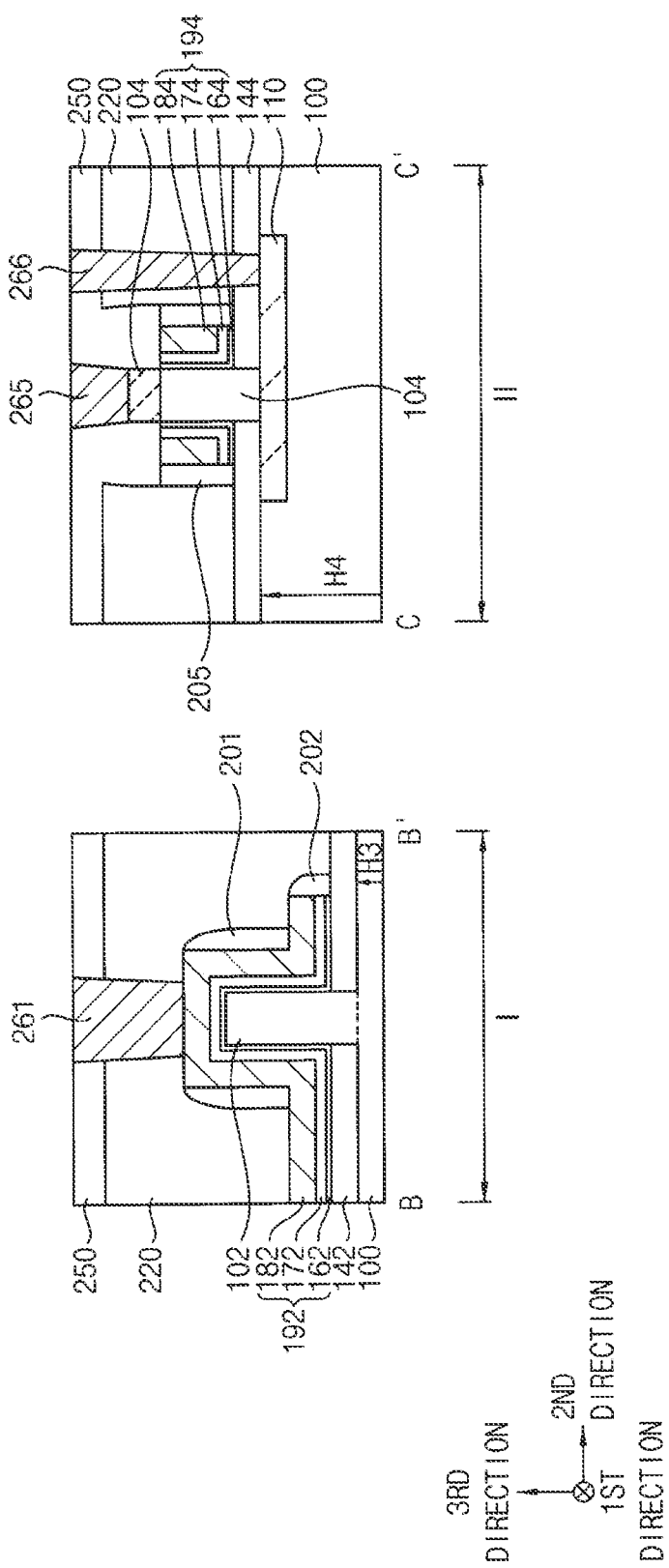

Referring to FIGS. 19 to 21, a second insulating interlayer 250 may be formed on the first insulating interlayer 220, the third impurity region 240, the second gate structure 194, and the sixth and seventh spacers 204 and 205 to fill the third recess 230, first and second contact plugs 261 and 262 may be formed through the first and second insulating interlayers 220 and 250 on the first region I of the substrate 100, and third to fifth contact plugs 264, 265 and 266 may be formed through the second insulating interlayer 250 and/or the first insulating interlayer 220 on the second region II of the substrate 100.

The first contact plug 261 may contact an upper surface (e.g., a surface facing away from the substrate 100 in the third direction) of the first gate structure 192, the second contact plug 262 may contact an upper surface of the second impurity region 210, the third contact plug 264 may contact an upper surface of the second gate structure 194, the fourth contact plug 265 may contact an upper surface of third impurity region 240, and the fifth contact plug 266 may contact an upper surface of the first impurity region 110 through the second spacer 144.

Each of the first to fifth contact plugs 261, 262, 264, 265 and 266 may include a metal, a metal nitride, a metal silicide, doped polysilicon, or the like. A metal silicide pattern may be further formed between the first to third impurity regions 110, 210 and 240 and the fifth, second and fourth contact plugs 266, 262 and 265, respectively.

The semiconductor device may be manufactured by the above processes. As described above, the first recess 120 may be formed on the first region I of the substrate 100, so that the third height H3 of the upper surface of the first region I of the substrate 100 on which the first semiconductor pattern 102 is not formed may be less than the fourth height H4 of the upper surface of the second region II of the substrate 100 on which the second semiconductor pattern 104 is not formed. In an implementation, in order to expose the upper portion of the second semiconductor pattern 104 on the second region II of the substrate 100 to form the third impurity region 240, an CMP process may be performed to remove the upper portion of the first insulating interlayer 220 instead of an etching process.

In an implementation, when a plurality of second semiconductor patterns 104 is formed, portions of the second gate structures 194 on the plurality of second semiconductor patterns 104, respectively, may be removed by a CMP process so that other portions may remain at a constant height, and may be etched by an etching process to a given thickness to expose upper portions of the second semiconductor patterns 104. In an implementation, the distribution (e.g., variation) of lengths of the second gate structures surrounding the sidewalls of the second semiconductor patterns 104 may be reduced (e.g., when compared to removing portions of second gate structures on second semiconductor patterns, respectively, by an etching process, and then removing other portions of the second gate structures by another etching process).

By the above processes, the semiconductor device including a fin-type field effect transistor (finFET) and a vertical-channel field effect transistor (vFET) on the first and second regions I and II, respectively, of the substrate 100 may be formed, and the semiconductor device may have the following structural characteristics.

A first transistor may be formed on the first region I of the substrate 100, and may include the first semiconductor pattern 102 extending in the first direction and protruding from the upper surface of the first region I of the substrate 100 upwardly in the third direction, the first gate structure 192 extending in the second direction to cover the upper surface and the sidewall in the second direction of the first semiconductor pattern 102, and the second impurity regions 210 on respective portions of the first semiconductor pattern 102 at opposite sides of the first gate structure 192 in the first direction. The first semiconductor pattern 102 may serve as a channel of the first transistor, and the second impurity regions 210 may include impurities having the same conductivity type to serve as source/drain layers, respectively, of the first transistor. Thus, the first transistor may be a finFET.

In an implementation, an upper surface of the second impurity region 210 may be lower than (e.g., closer to the substrate 100 in the third direction) an uppermost surface (e.g., surface farthest from the substrate 100 in the third direction) of the first gate structure 192.

A second transistor may be formed on the second region II of the substrate 100, and may include the second semiconductor pattern 104 extending in the first direction and protruding from the upper surface of the second region II of the substrate 100 upwardly in the third direction, the second gate structure 194 extending in the first direction to cover the sidewall of the second semiconductor pattern 102, a first impurity region 110 under the second semiconductor pattern 104 (at an upper portion of the second region II of the substrate 100), and the third impurity region 240 on the second semiconductor pattern 104. The second semiconductor pattern 104 may serve as a channel of the second transistor, and the first and third impurity regions 110 and 240 may include impurities having the same conductivity type to serve as source/drain layers, respectively, of the second transistor. Thus, the second transistor may be a vFET.

In an implementation, the third height H3 of the upper surface of the first region I of the substrate 100 may be less than the fourth height H4 of the upper surface of the second region II of the substrate 100. In an implementation, the uppermost surface of the first gate structure 192 may be lower than an upper surface of the third impurity region 240.

In an implementation, the first and second gate structures 192 and 194 may be formed on the first and second spacers, 142 and 144, respectively.

In an implementation, the third spacers 201 may be formed on portions of the first gate structures 192 on opposite sidewalls, respectively, of the first semiconductor pattern 102 in the second direction, the fourth spacer 202 may cover a sidewall of the first gate structure 192, and the fifth spacer 203 may cover a sidewall of the second impurity region 210. The sixth spacers 204 may be formed on respective portions of the second gate structure 194 on opposite sidewalls of the second semiconductor pattern 104 in the first direction, and the seventh spacer 205 may cover a sidewall of the second gate structure 194.

In an implementation, the first gate structure 192 may include the first interface pattern 162, the first gate insulation pattern 172, and the first gate electrode 182 sequentially stacked on a surface of the first semiconductor pattern 102 and an upper surface of the first spacer 142, and the second gate structure 194 may include the second interface pattern 164, the second gate insulation pattern 174, and the second gate electrode 184 sequentially stacked on a sidewall of the second semiconductor pattern 104 and an upper surface of the second spacer 144.

In an implementation, the first contact plug 261 may be electrically connected to the first gate structure 192, and the second contact plugs 262 may be electrically connected to the second impurity regions 210, respectively. The third contact plug 264 may be electrically connected to the second gate structure 194, the fourth contact plug 265 may be electrically connected to the third impurity region 240, and the fifth contact plug 266 may be electrically connected to the first impurity region 110.

FIGS. 22 to 31 are cross-sectional views of stages in a method of manufacturing a semiconductor device in accordance with example embodiments. Particularly, FIGS. 22, 24, 26, 28 and 30 are cross-sectional views taken along lines A-A' of corresponding plan views, respectively, and FIGS. 23, 25, 27, 29 and 31 are cross-sectional views taken along lines B-B' and C-C' of corresponding plan views, respectively.

This method may include processes substantially the same as or similar to those illustrated with reference to FIGS. 1 to 21, and thus repeated descriptions thereon may be omitted herein.

Figure 22:
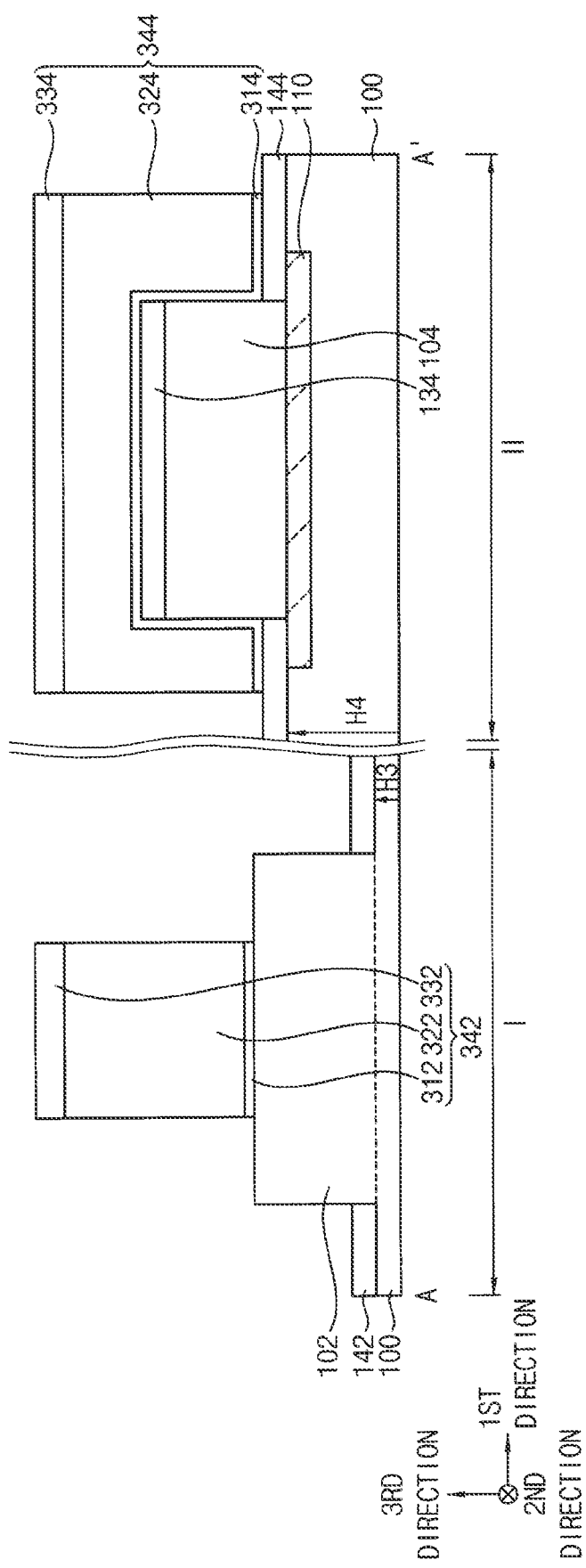
FIGS. 22 to 31 are cross-sectional views of stages in a method of manufacturing a semiconductor device in accordance with example embodiments.
Figure 23:
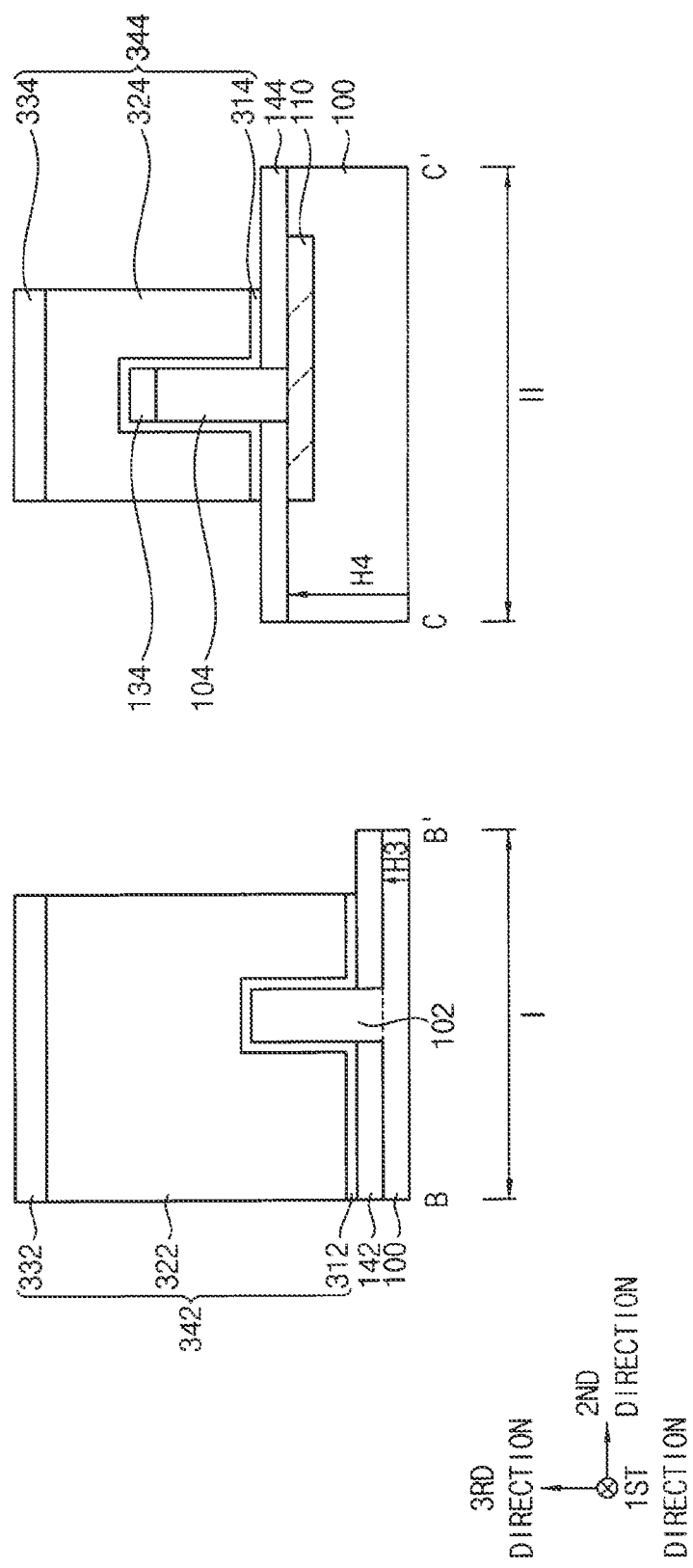

Referring to FIGS. 22 and 23, after performing processes substantially the same as or similar to those illustrated with reference to FIGS. 1 to 6, a dummy gate structure layer may be formed on the first and second spacers 142 and 144, the first and second semiconductor patterns 102 and 104, and the second hard mask 134, and may be patterned to form first and second dummy gate structures 342 and 344 on the first and second regions I and II, respectively, of the substrate 100.

The first and second dummy gate structures 342 and 344 may have uppermost surfaces substantially coplanar with each other in the third direction (e.g., substantially the same distance from the substrate 100 in the third direction), which may be different from the first and second gate structures 192 and 194 conformally formed as illustrated with reference to FIGS. 8 and 9. In an implementation, the first and second dummy gate structures 342 and 344 may have the same layout as the first and second gate structures 192 and 194.

The first dummy gate structure 342 may include a first dummy gate insulation pattern 312, a first dummy gate electrode 322, and a first dummy gate mask 332 sequentially stacked in the third direction, and the second dummy gate structure 344 may include a second dummy gate insulation pattern 314, a second dummy gate electrode 324 and a second dummy gate mask 334 sequentially stacked in the third direction.

Each of the first and second dummy gate insulation patterns 312 and 314 may include an oxide, e.g., silicon oxide, each of the first and second dummy gate electrodes 322 and 324 may include, e.g., polysilicon, and each of the first and second dummy gate masks 332 and 334 may include a nitride, e.g., silicon nitride.

Figure 24:
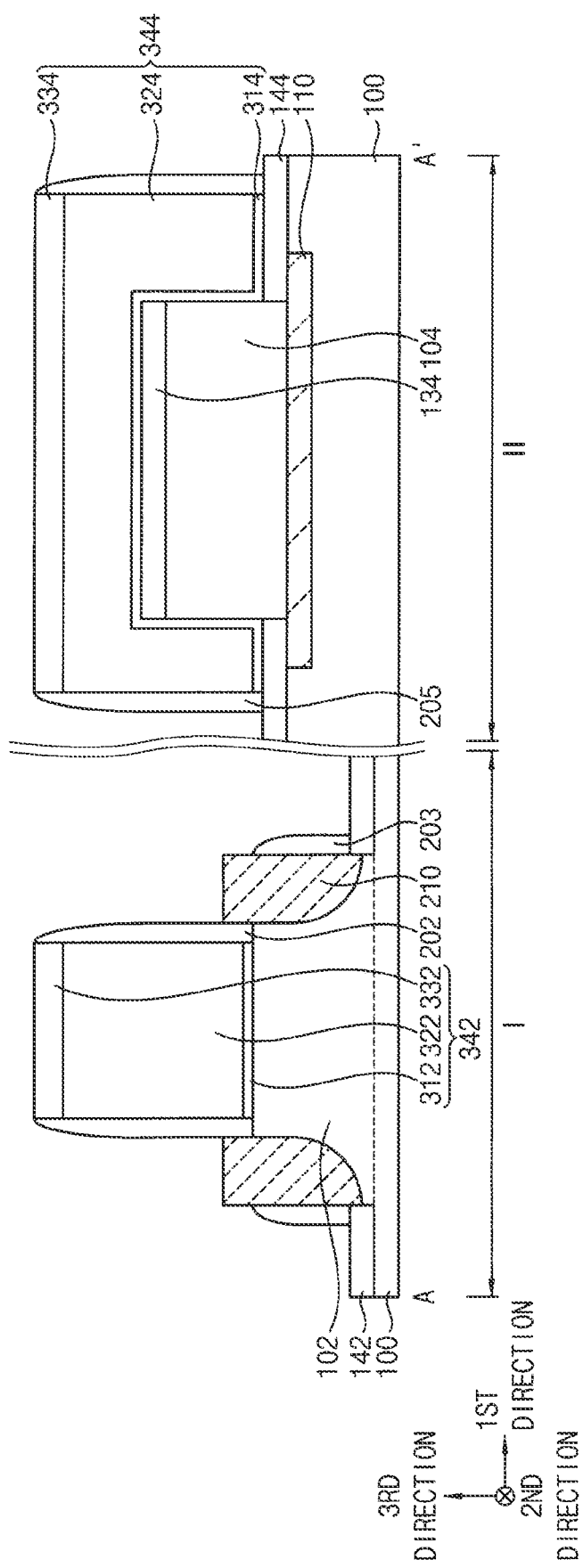
Figure 25:
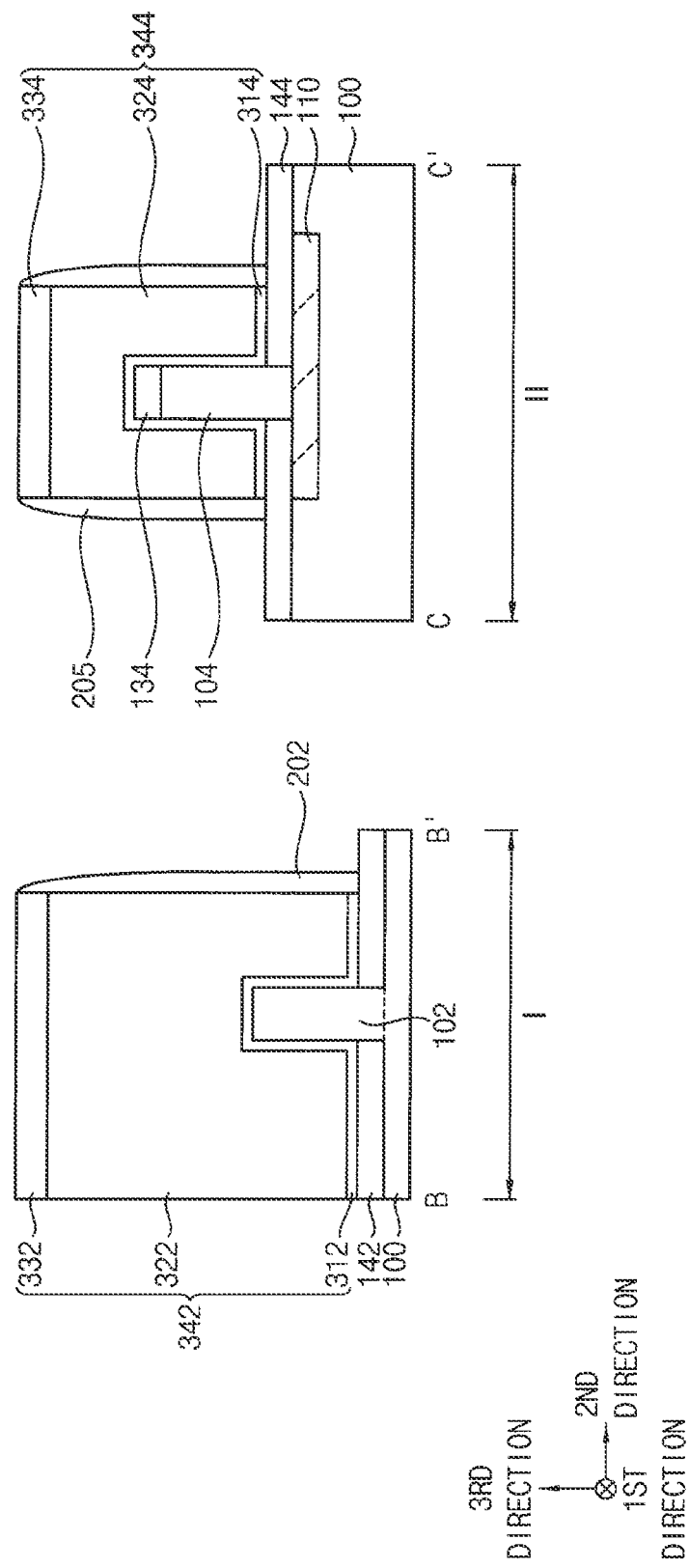

Referring to FIGS. 24 and 25, processes substantially the same as or similar to those illustrated with reference to FIGS. 11 to 13 may be performed.

In an implementation, the fourth spacer 202 may be formed on a sidewall of the first dummy gate structure 342, the fifth spacer 203 may be formed on a sidewall of a portion of the first semiconductor pattern 102 not covered by the first dummy gate structure 342, and the seventh spacer 205 may be formed on a sidewall of the second dummy gate structure 344.

In an implementation, unlike the first and second gate structures 192 and 194, the first and second dummy gate structures 342 and 344 may not be conformally formed, and thus respective portions of the first and second dummy gate structures 342 and 344 on the first and second semiconductor patterns 102 and 104 and on the first and second spacers 142 and 144 may not have a height difference, so that the third and sixth spacers 201 and 204 may not be formed.

A portion of the first semiconductor pattern 102 not covered by the first dummy gate structure 342 and the fourth spacer 202 may be etched to form the second recess, and a SEG process may be performed using a portion of the first semiconductor pattern 102 exposed by the second recess as a seed to form the second impurity region 210 in the second recess.

Figure 26:
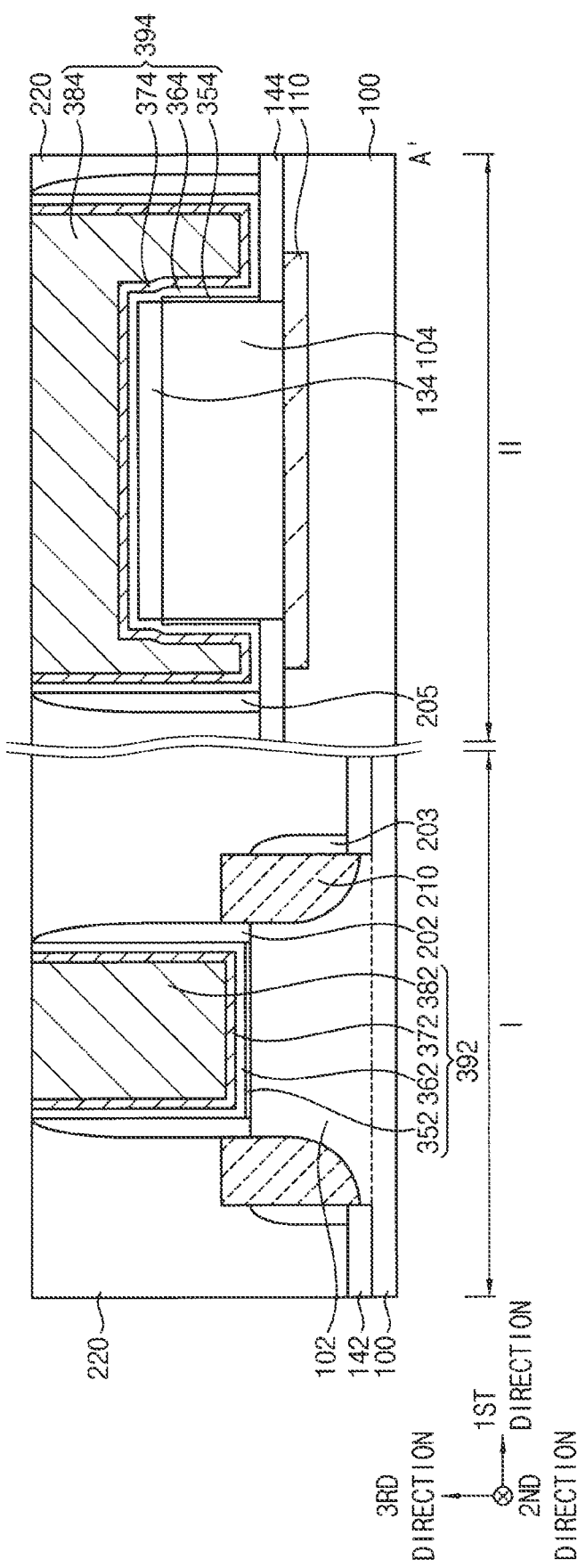
Figure 27:
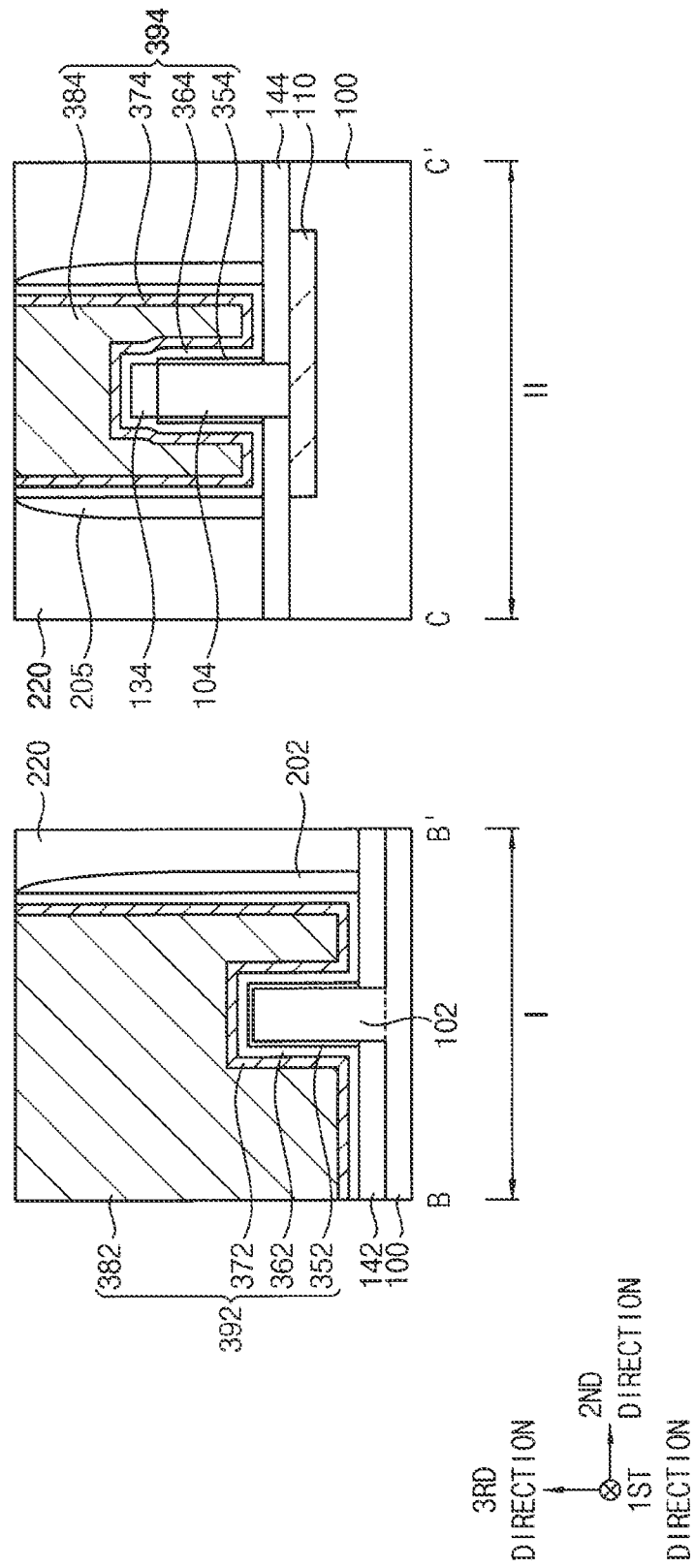

Referring to FIGS. 26 and 27, the first insulating interlayer 220 may be formed on the first and second spacers 142 and 144 to cover the first and second dummy gate structures 342 and 344, the fourth, fifth and seventh spacers 202, 203 and 205, and the second impurity region 210, and may be planarized until upper surfaces of the first and second dummy gate structures 332 and 334 are exposed.

The exposed first and second dummy gate masks 332 and 334, and the first and second dummy gate electrodes 322 and 324 and the first and second dummy gate insulation patterns 312 and 314 thereunder may be removed to form a fourth recess exposing an upper surface and a sidewall of the first semiconductor pattern 102, an upper surface of the first spacer 142, and an inner sidewall of the fourth spacer 202 on the first region I of the substrate 100, and to form a fifth recess exposing an upper surface and a sidewall of the second hard mask 134, a sidewall of the second semiconductor pattern 104, an upper surface of the second spacer 144, and an inner sidewall of the seventh spacer 205 on the second region II of the substrate 100.

Third and fourth interface patterns 352 and 354 may be formed on the upper surfaces and sidewalls of the first and second semiconductor patterns 102 and 104 exposed by the fourth and fifth recesses, respectively, a gate insulation layer and a work function control layer may be sequentially stacked on surfaces of the third and fourth interface patterns 352 and 354, an upper surface and a sidewall of the second hard mask 134, the upper surfaces of the first and second spacers 142 and 144, and the inner sidewalls of the fourth and seventh spacers 202 and 205, and a gate electrode layer may be formed on the work function control layer to fill the fourth and fifth recesses.

The gate electrode layer, the work function control layer, and the gate insulation layer may be planarized until an upper surface of the first insulating interlayer 220 is exposed to form a third gate structure 392 in the fourth recess on the first region I of the substrate 100 and to form a fourth gate structure 394 in the fifth recess on the second region II of the substrate 100. The third gate structure 392 may include a third interface pattern 352, a third gate insulation pattern 362, a first work function control pattern 372, and a third gate electrode 382, and the fourth gate structure 394 may include a fourth interface pattern 354, a fourth gate insulation pattern 364, a second work function control pattern 374 and a fourth gate electrode 384.

Each of the first and second work function control patterns 372 and 374 may include, e.g., a metal, a metal nitride, a metal silicide, a metal alloy, or the like.

Figure 28:
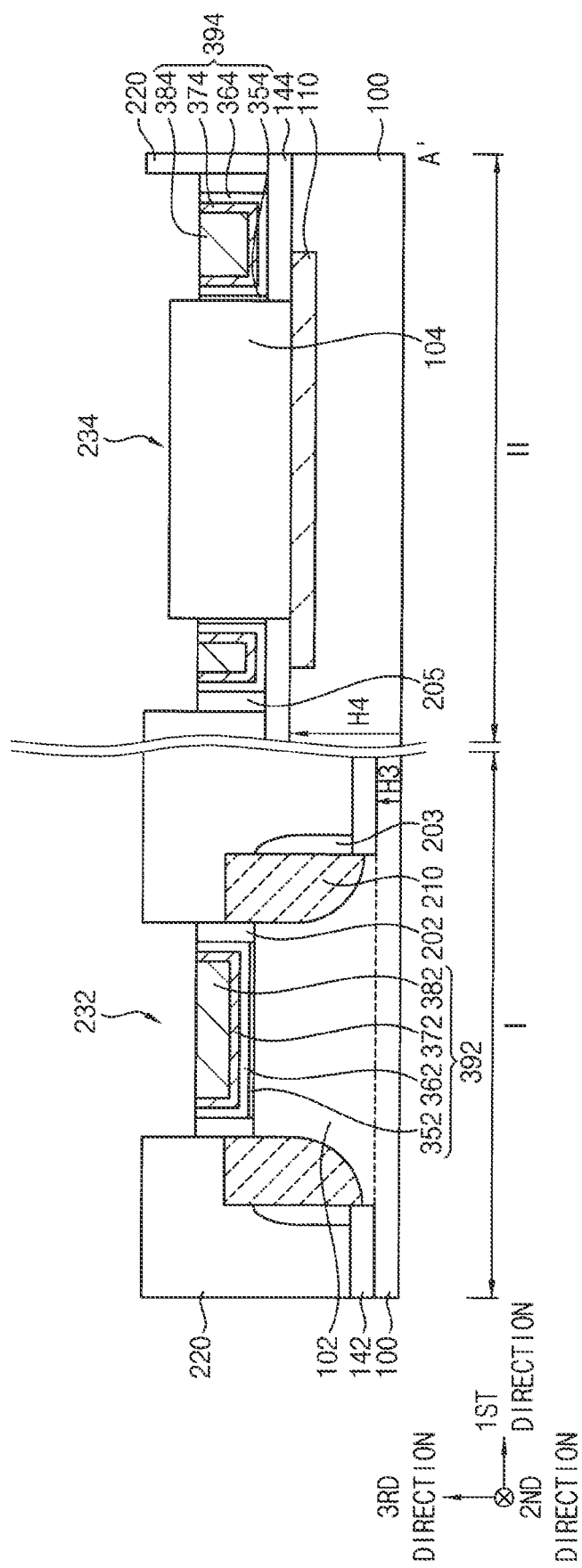
Figure 29:
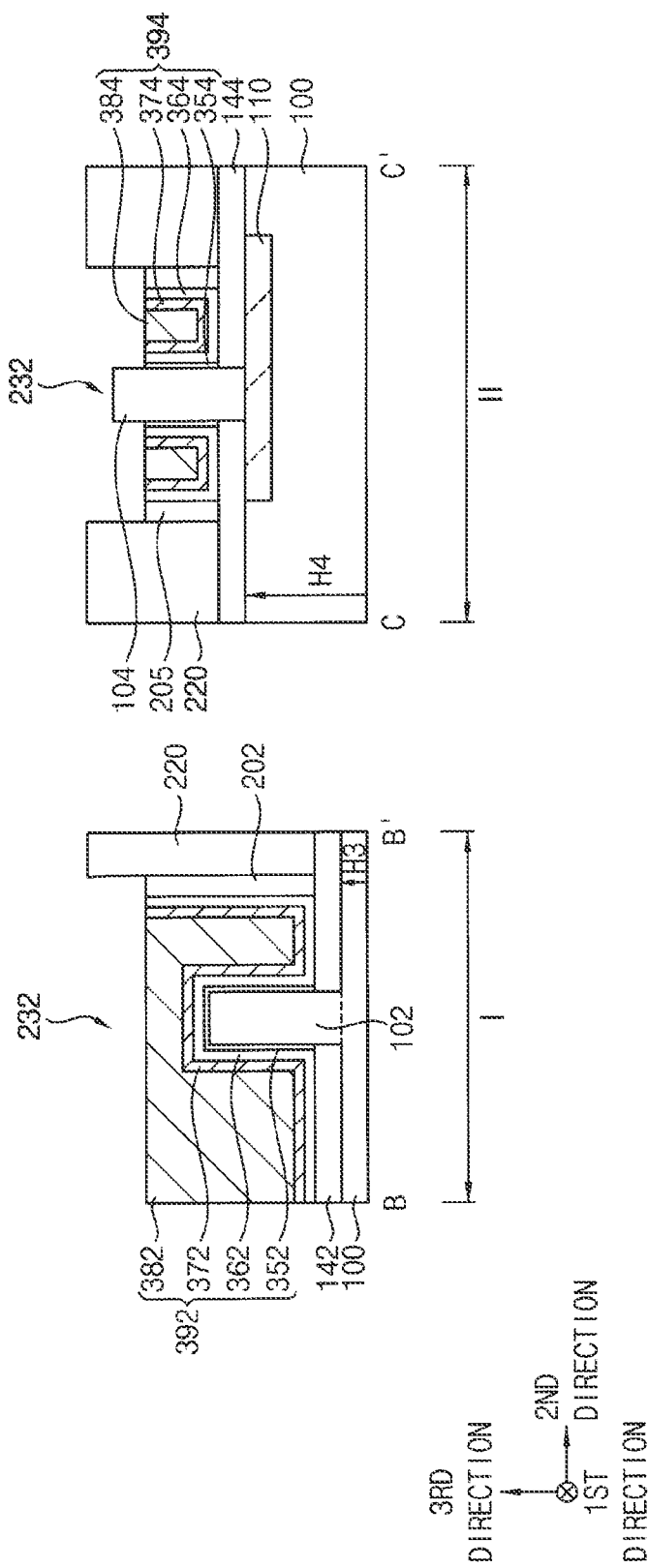

Referring to FIGS. 28 and 29, processes substantially the same as or similar to those illustrated with reference to FIGS. 14 and 15 may be performed.

In an implementation, the first insulating interlayer 220 may be planarized until the upper surface of the second hard mask 134 is exposed, and during the planarization process, a portion of the fourth gate structure 394 on the upper surface of the second hard mask 134 may be removed on the second region II of the substrate 100, and a portion of the third gate structure 392 having a thickness corresponding to the removed portion of the fourth gate structure 394 may be removed on the first region I of the substrate 100. In an implementation, the planarization process may be performed by a CMP process.

An upper portion of the fourth gate structure 394, the second hard mask 134, and an upper portion of the seventh spacer 205 may be removed by an etching process, and thus a seventh recess 234 may be formed to expose an upper portion of the second semiconductor pattern 104. During the etching process, an upper portion of the third gate structure 392 and an upper portion of the fourth spacer 202 may be also removed to form a sixth recess 232.

In an implementation, the process for forming the seventh recess 234 to expose the upper portion of the second semiconductor pattern 104 on the second region II of the substrate 100 may be performed only once simultaneously with the process for forming the sixth recess 232 on the first region I of the substrate 100, after the CMP process for exposing the upper surface of the second hard mask 134, which is possible because the third height H3 of the upper surface of the first region I of the substrate 100 is less than the fourth height H4 of the second region II of the substrate 100. If the third height H3 of the upper surface of the first region I of the substrate 100 were to be equal to the fourth height H4 of the second region II of the substrate 100, in order to expose the upper portion of the second semiconductor pattern 104 on the second region II of the substrate 100, an etching process on the fourth gate structure 394 would be performed twice, which could cause distribution of lengths of the fourth gate structures 394 covering the second semiconductor patterns 104, respectively. The etching process for exposing the upper portion of the second semiconductor pattern 104 on the second region II of the substrate 100 may be performed once, only if an additional etching mask is used therein.

In an implementation, the upper surface of the first region I of the substrate 100 may be lower than the upper surface of the second region II of the substrate 100, and thus, after performing the CMP on the third and fourth gate structures 392 and 394 until the upper surface of the second hard mask 134 is exposed, the etching process may be commonly performed on the third and fourth gate structures 392 and 394, so that the upper portion of the second semiconductor pattern 104 on the second region II of the substrate 100 may be exposed.

Figure 30:
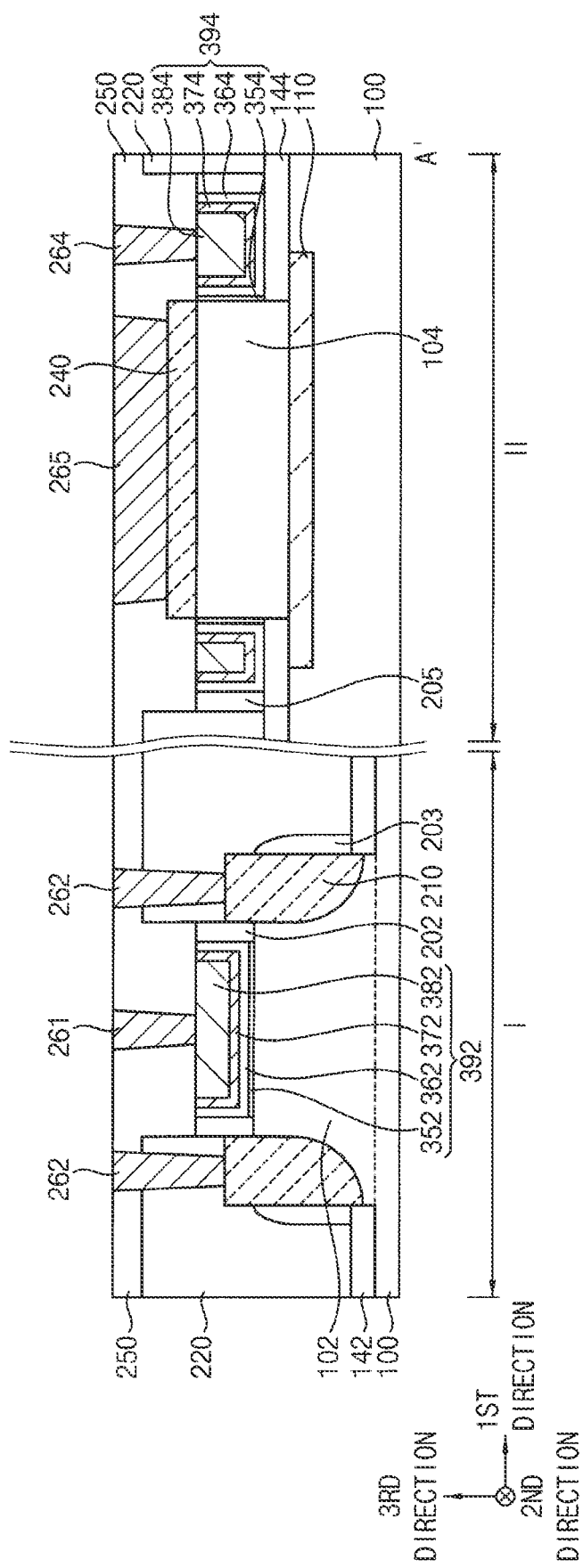
Figure 31:
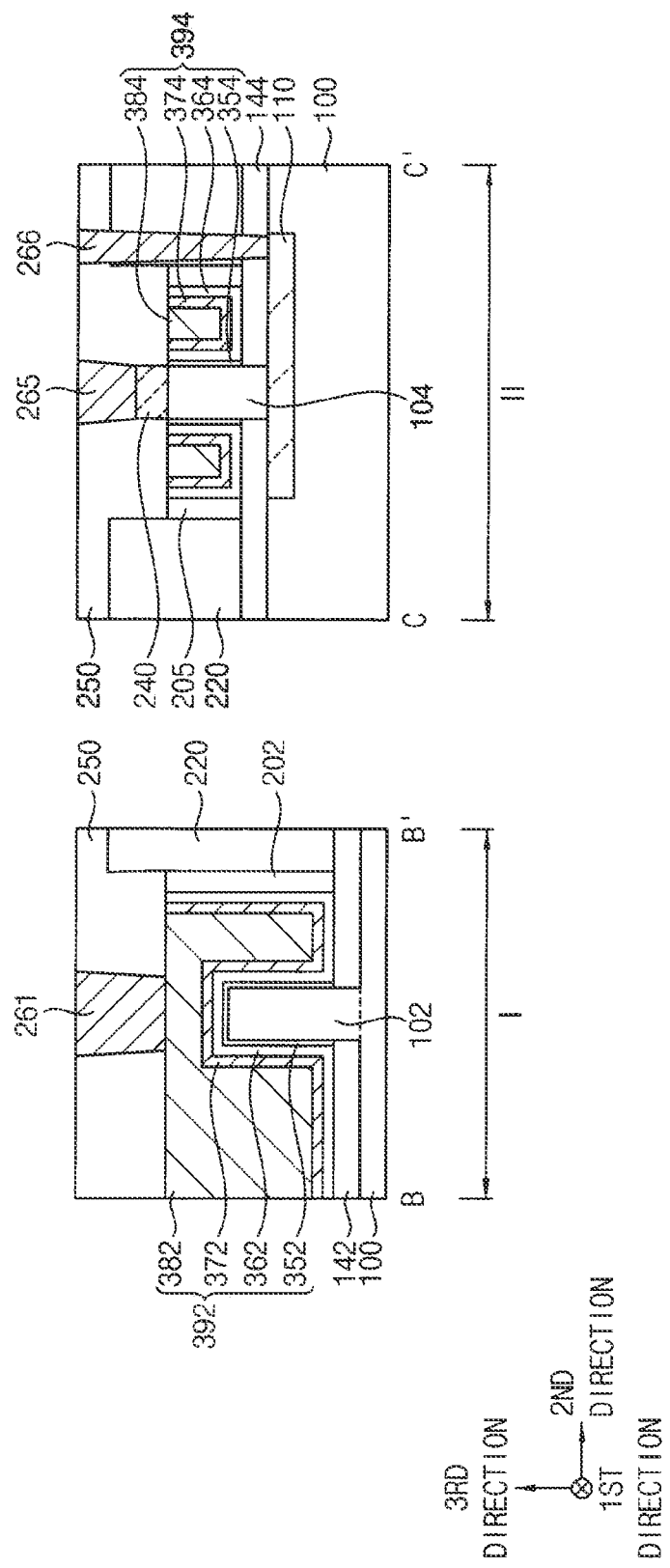

Referring to FIGS. 30 and 31, processes substantially the same as or similar to those illustrated with reference to FIGS. 16 to 21 may be performed to complete the fabrication of the semiconductor device.

The first contact plug 261 may contact an upper surface of the third gate structure 392, the second contact plug 262 may contact an upper surface of the second impurity region 210. The third contact plug 264 may contact an upper surface of the fourth gate structure 394, the fourth contact plug 265 may contact an upper surface of third impurity region 240, and the fifth contact plug 266 may contact an upper surface of the first impurity region 110 through the second spacer 144.

The semiconductor device may be similar to that of FIGS. 19 to 21, and may have the following additional characteristics.

In an implementation, the third gate structure 392 may include the third interface pattern 352 on the surface of the first semiconductor pattern 102, and the third gate insulation pattern 362, the first work function control pattern 372 and the third gate electrode 382 sequentially stacked from the third interface pattern 352, the upper surface of the first spacer 142, and the inner sidewall of the fourth spacer 202. The fourth gate structure 394 may include the fourth interface pattern 354 on the surface of the second semiconductor pattern 104, and the fourth gate insulation pattern 364, the second work function control pattern 374 and the fourth gate electrode 384 sequentially stacked from the fourth interface pattern 354, the upper surface of the second spacer 144, and the inner sidewall of the seventh spacer 205.

Figure 36:
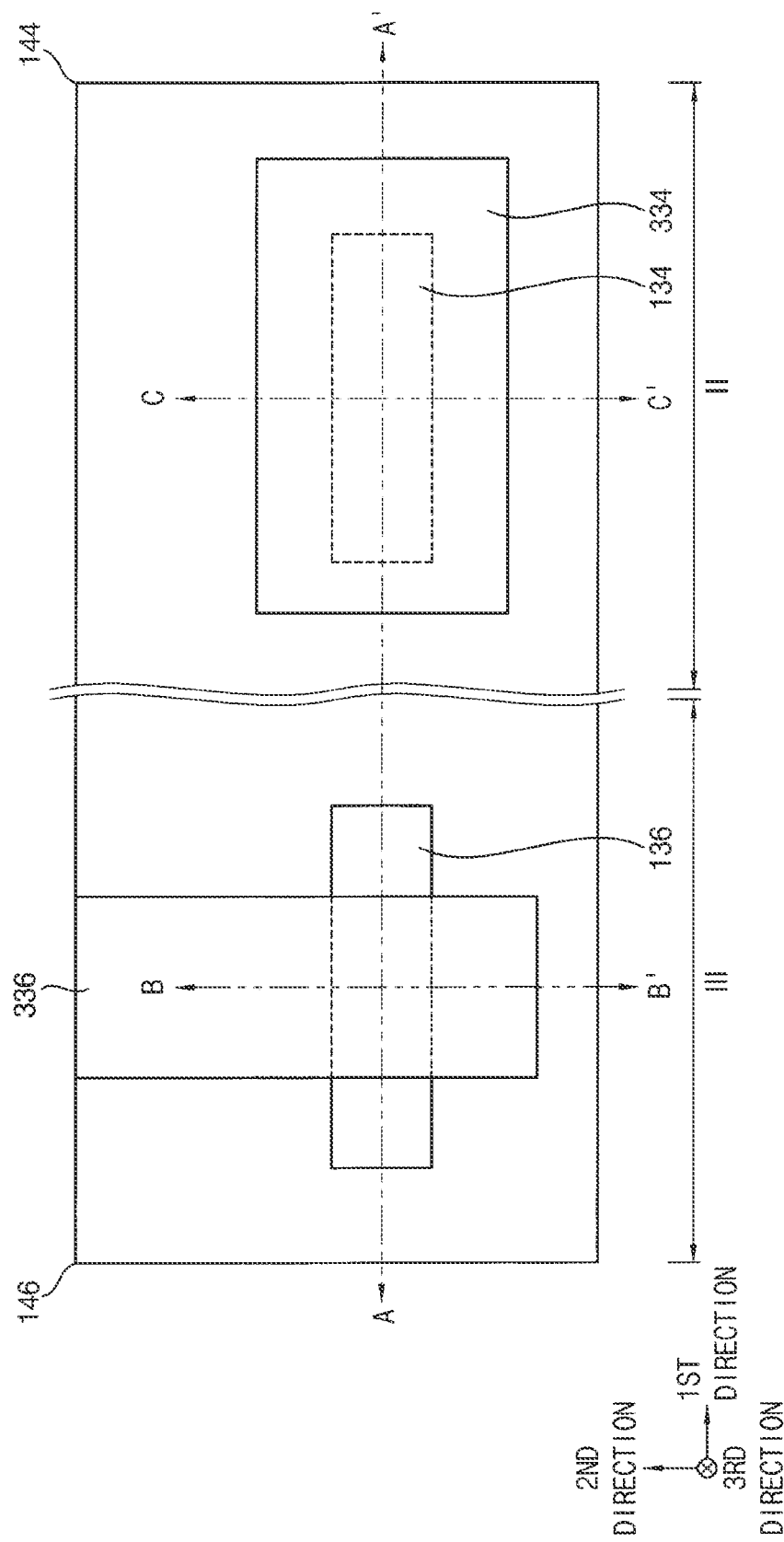
Figure 37:
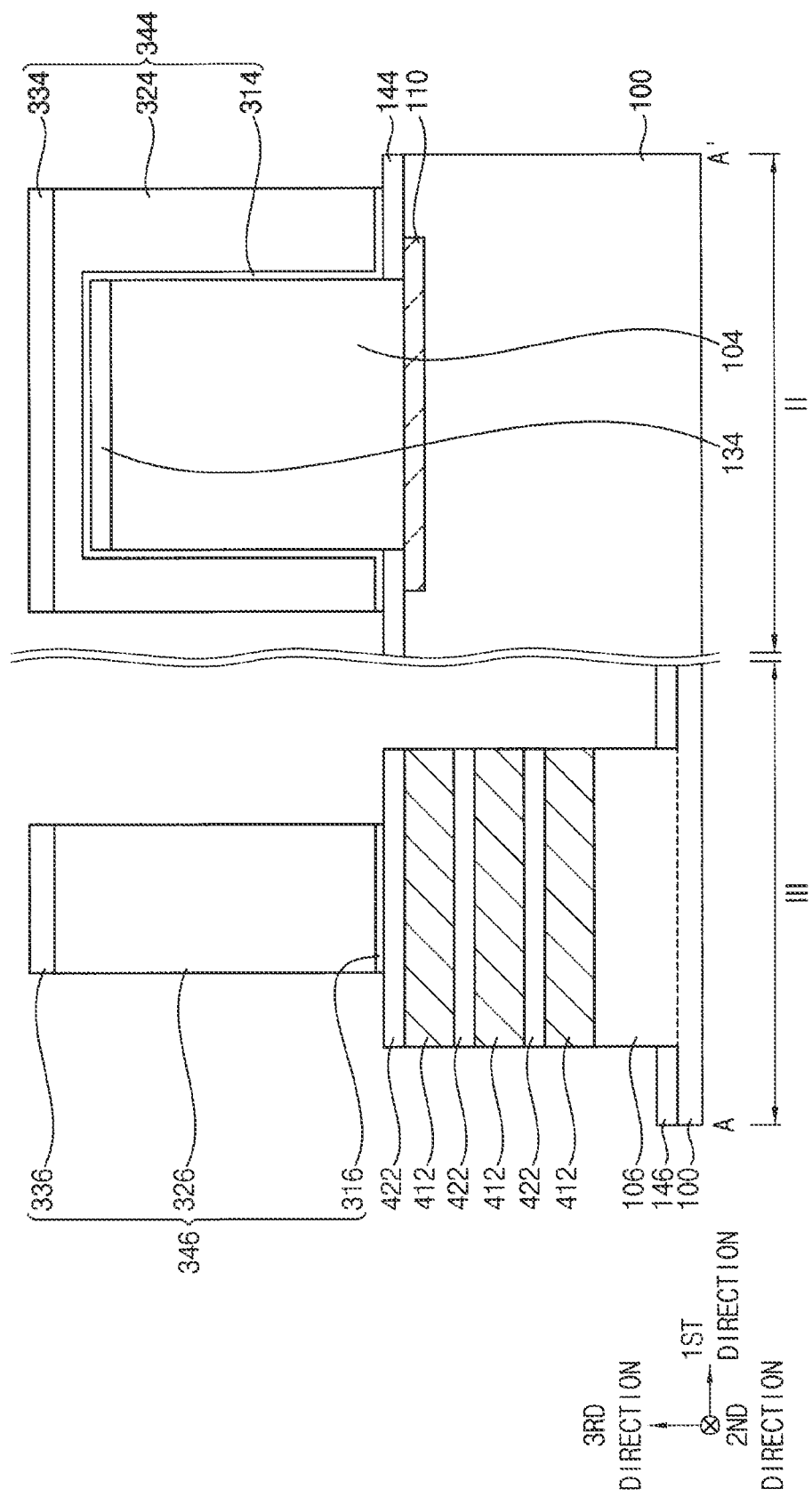
Figure 38:
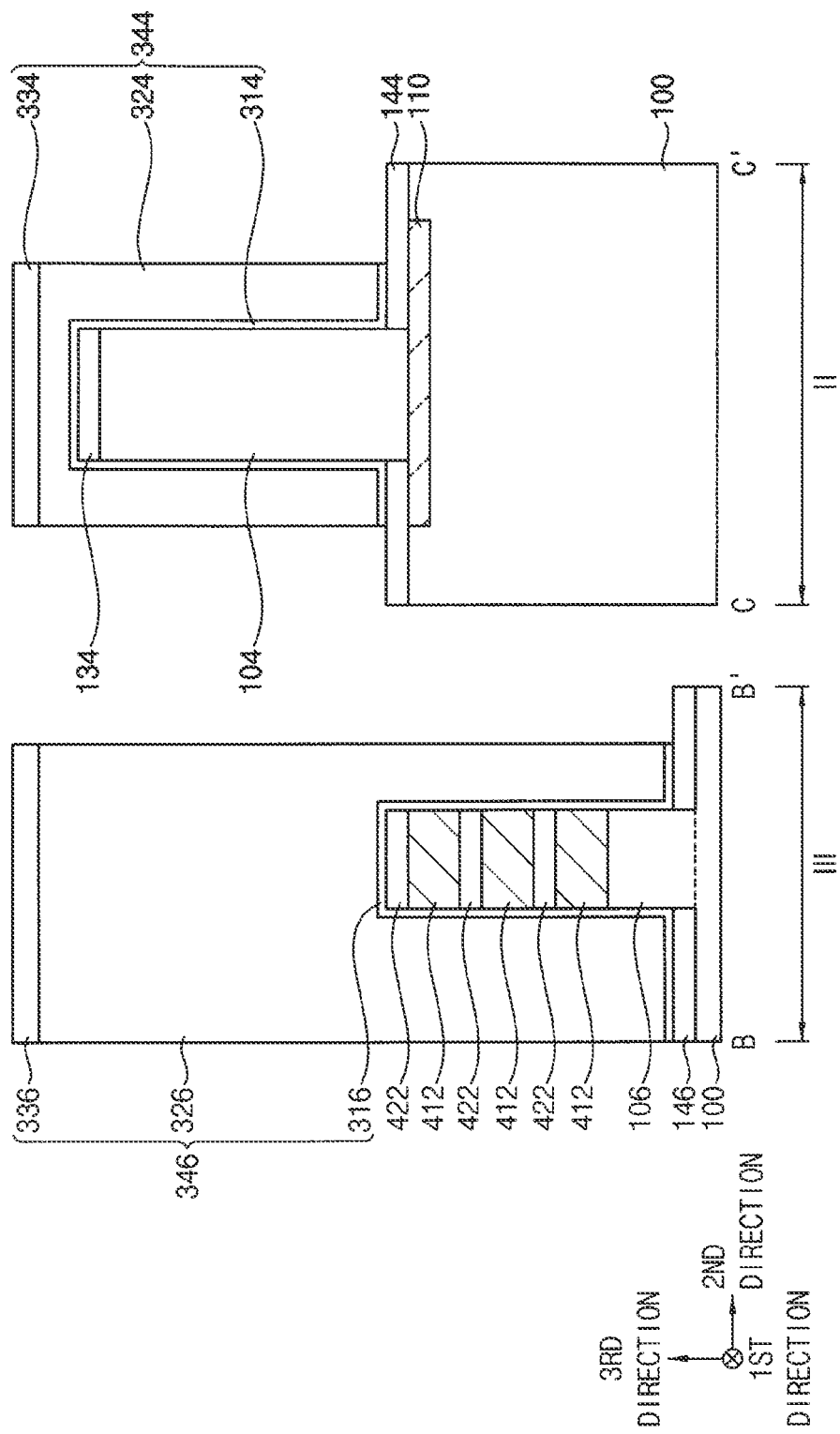
Figure 39:
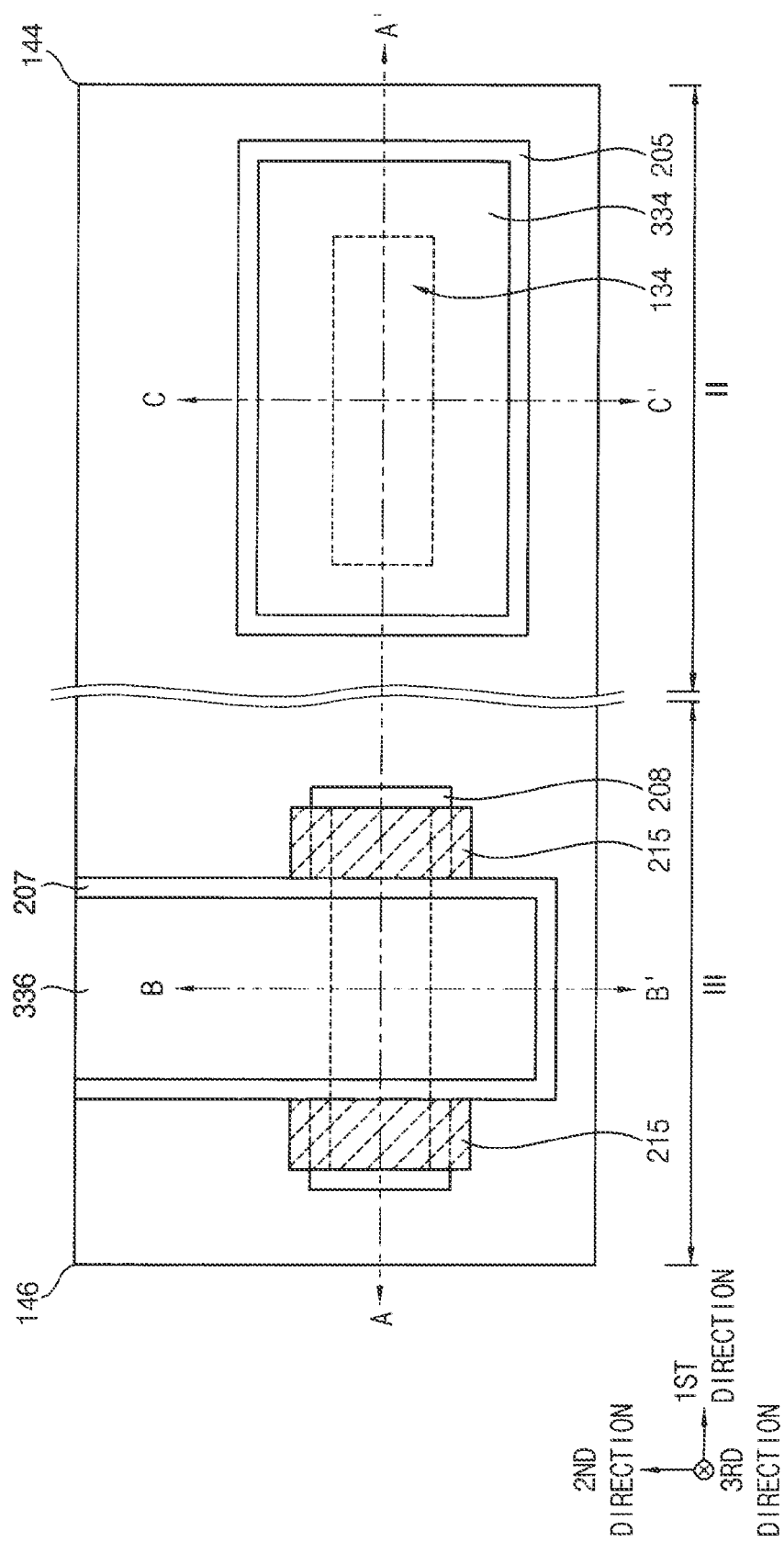

FIGS. 32 to 45 are plan views and cross-sectional views of stages in a method of manufacturing a semiconductor device in accordance with example embodiments. FIGS. 33, 36 and 39 are the plan views, FIGS. 32, 34, 37, 40, 42 and 44 are cross-sectional views taken along lines A-A' of corresponding plan views, respectively, and FIGS. 35, 38, 41, 43 and 45 are cross-sectional views taken along lines B-B' and C-C' of corresponding plan views, respectively.

This method may include processes substantially the same as or similar to those illustrated with reference to FIGS. 1 to 21 or FIGS. 22 to 31, and thus repeated descriptions thereon may be omitted herein.

Figure 32:
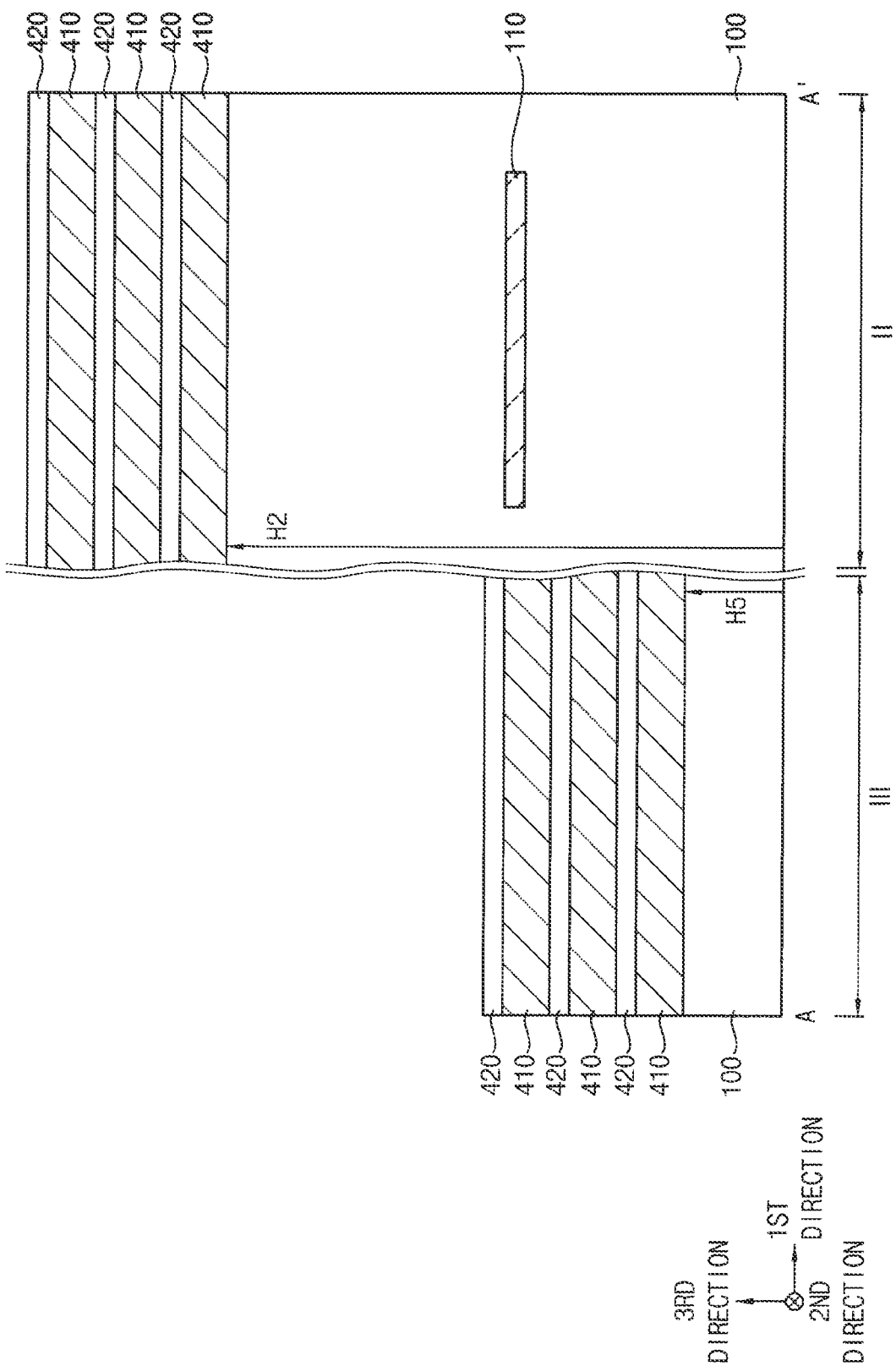
Figure 33:
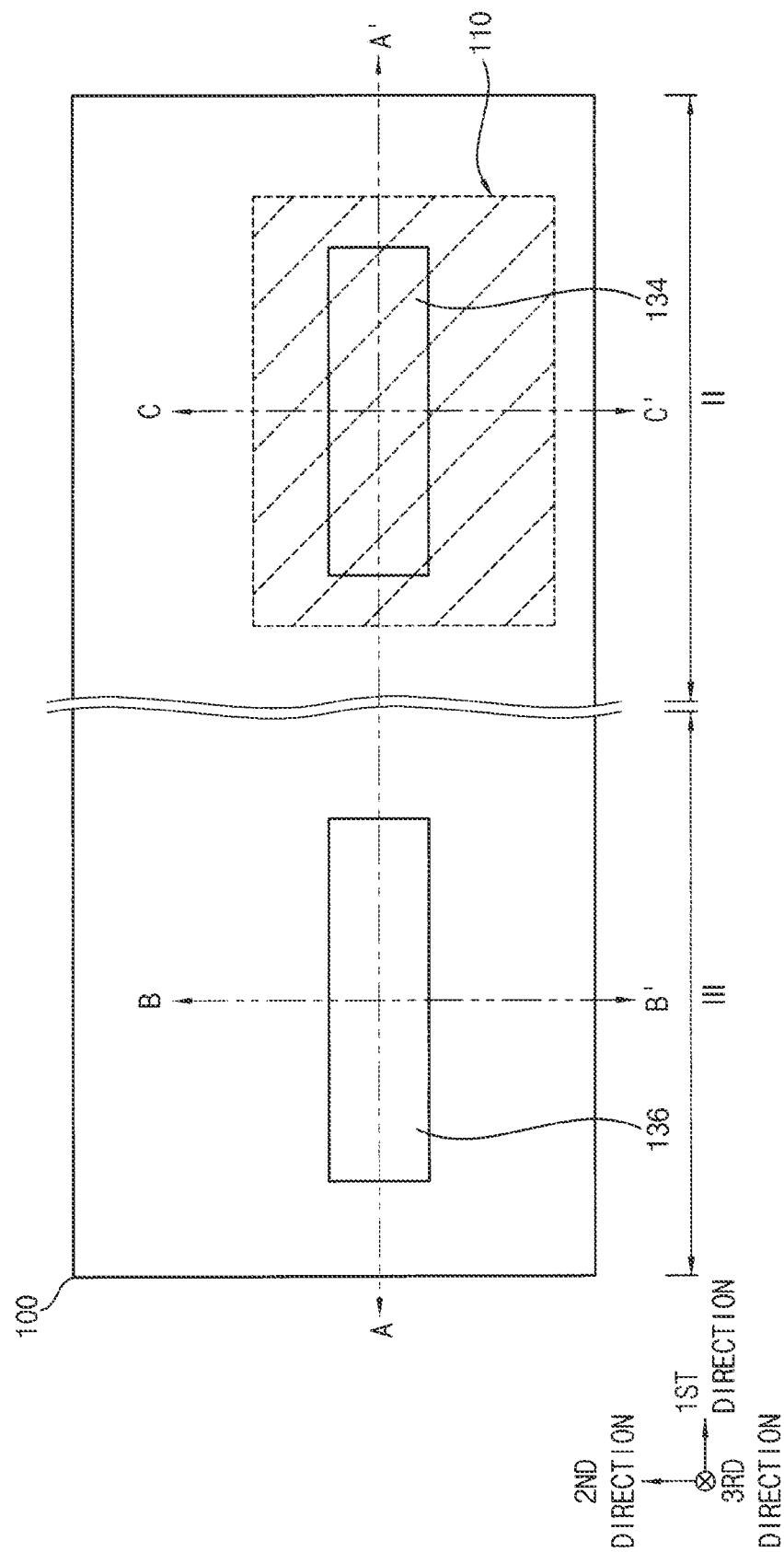

Referring to FIG. 32, processes substantially the same as or similar to those illustrated with reference to FIGS. 1 and 2 may be performed on the substrate 100 including the second region II and a third region III.

In an implementation, after forming the first impurity region 110 at a portion of the second region II of the substrate 100, a upper portion of the third region III of the substrate 100 may be removed to form an eighth recess. As the eighth recess is formed on the third region III of the substrate 100, a fifth height of an upper surface of the third region III of the substrate 100 may be less than the second height H2 of the upper surface of the second region II of the substrate 100.

A second sacrificial layer 410 and a semiconductor layer 420 may be alternately and repeatedly stacked on the second and third regions II and III of the substrate 100.

In an implementation, the second sacrificial layer 410 and the semiconductor layer 420 may be formed by an SEG process using an upper portion of the substrate 100 as a seed. In an implementation, the second sacrificial layer 410 may be formed by an SEG process using a silicon source gas, e.g., dichlorosilane ($SiH_2Cl_2$) gas, a germanium source gas, e.g., germane ($GeH_4$) gas, and thus a single crystalline silicon-germanium layer may be formed. In an implementation, the semiconductor layer 420 may be formed by an SEG process using a silicon source gas, e.g., disilane ($Si_2H_6$) gas, and thus a single crystalline silicon layer may be formed.

Figure 34:
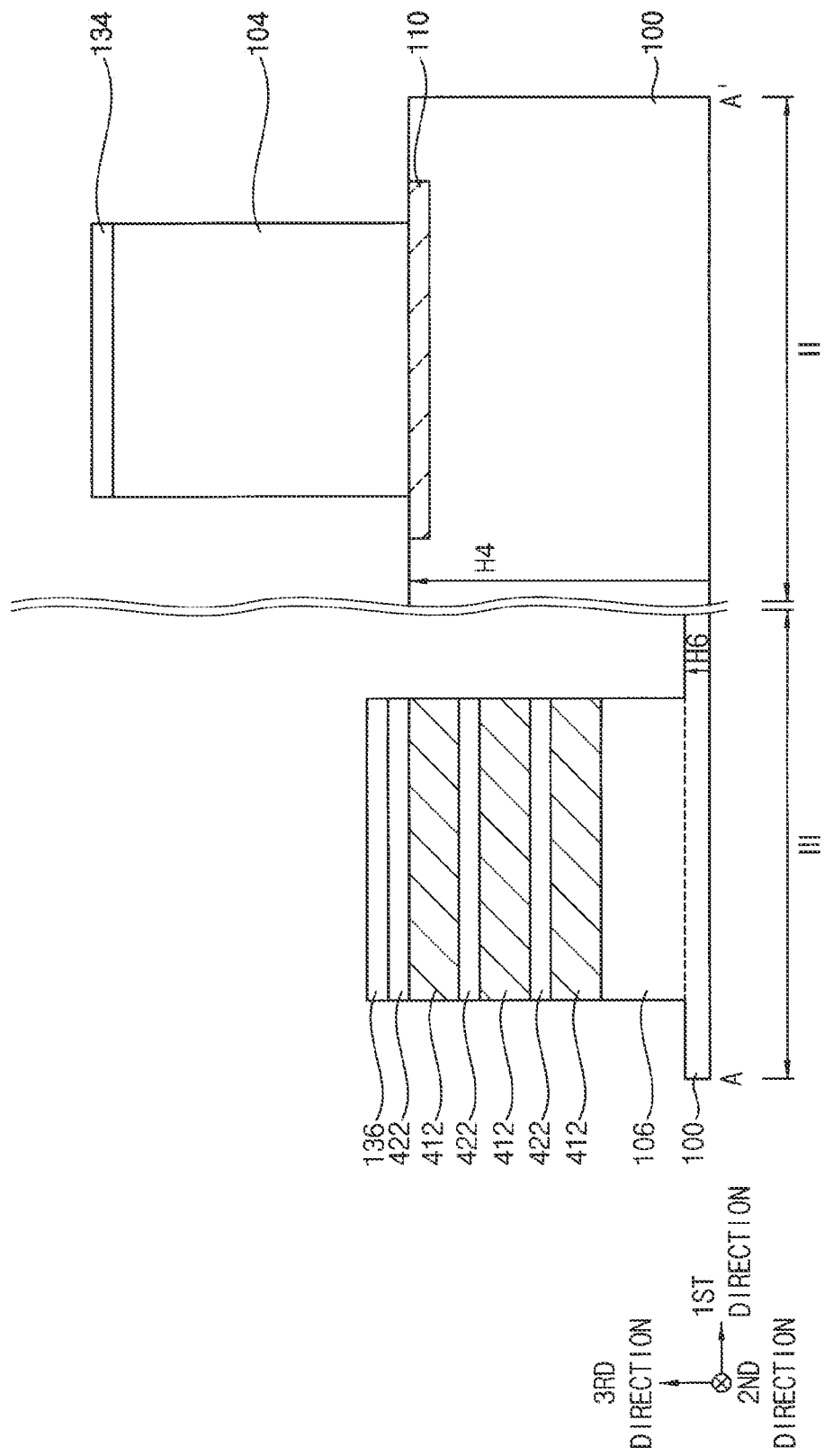

Referring to FIGS. 33 to 35, the second sacrificial layers 410 and the semiconductor layers 420 alternately and repeatedly stacked on the second region II of the substrate 100 may be removed to expose an upper surface of the second region II of the substrate 100, and processes substantially the same as or similar to those illustrated with reference to FIGS. 3 to 5 may be performed.

In an implementation, the second hard mask 134 and a third hard mask 136 may be formed on the exposed upper surface of the second region II of the substrate 100 and an upper surface of an uppermost one of the semiconductor layers 420 on the third region III of the substrate 100, respectively, and an upper portion of the second region II of the substrate 100, and the second sacrificial layers 410 and the semiconductor layers 420 alternately and repeatedly stacked and an upper portion of the third region III of the substrate 100 may be etched using the second and third hard masks 134 and 136, respectively, as an etching mask.

In an implementation, the second semiconductor pattern 104 may be formed on the second region II of the substrate 100 to protrude upwardly therefrom (e.g., in the third direction), and the second hard mask 134 may be formed on the second semiconductor pattern 104. A third semiconductor pattern 106, and second sacrificial patterns 412 and fourth semiconductor patterns 422 alternately and repeatedly stacked on the third semiconductor pattern 106 may be formed on the third region III of the substrate 100, and the third hard mask 136 may be formed on an uppermost one of the third semiconductor patterns 422.

As the second and third semiconductor patterns 104 and 106 are formed, upper surfaces of the second and third regions II and III of the substrate 100 (on which the second and third semiconductor patterns 104 and 106 are not formed, respectively) may have fourth and sixth heights H4 and H6, respectively, and the sixth height H6 may be less than the fourth height H4.

Referring to FIGS. 36 to 39, processes substantially the same as or similar to those illustrated with reference to FIGS. 22 and 23 may be performed.

In an implementation, a second dummy gate structure 344 and a third dummy gate structure 346 may be formed on the second and third regions II and III of the substrate 100, and the second spacer 144 and an eighth spacer 146 may be formed to cover lower sidewalls of the second and third dummy gate structures 344 and 346, respectively.

The third dummy gate structure 346 may include a third dummy gate insulation pattern 316, a third dummy gate electrode 326 and a third dummy gate mask 336 sequentially stacked in the third direction.

Figure 40:
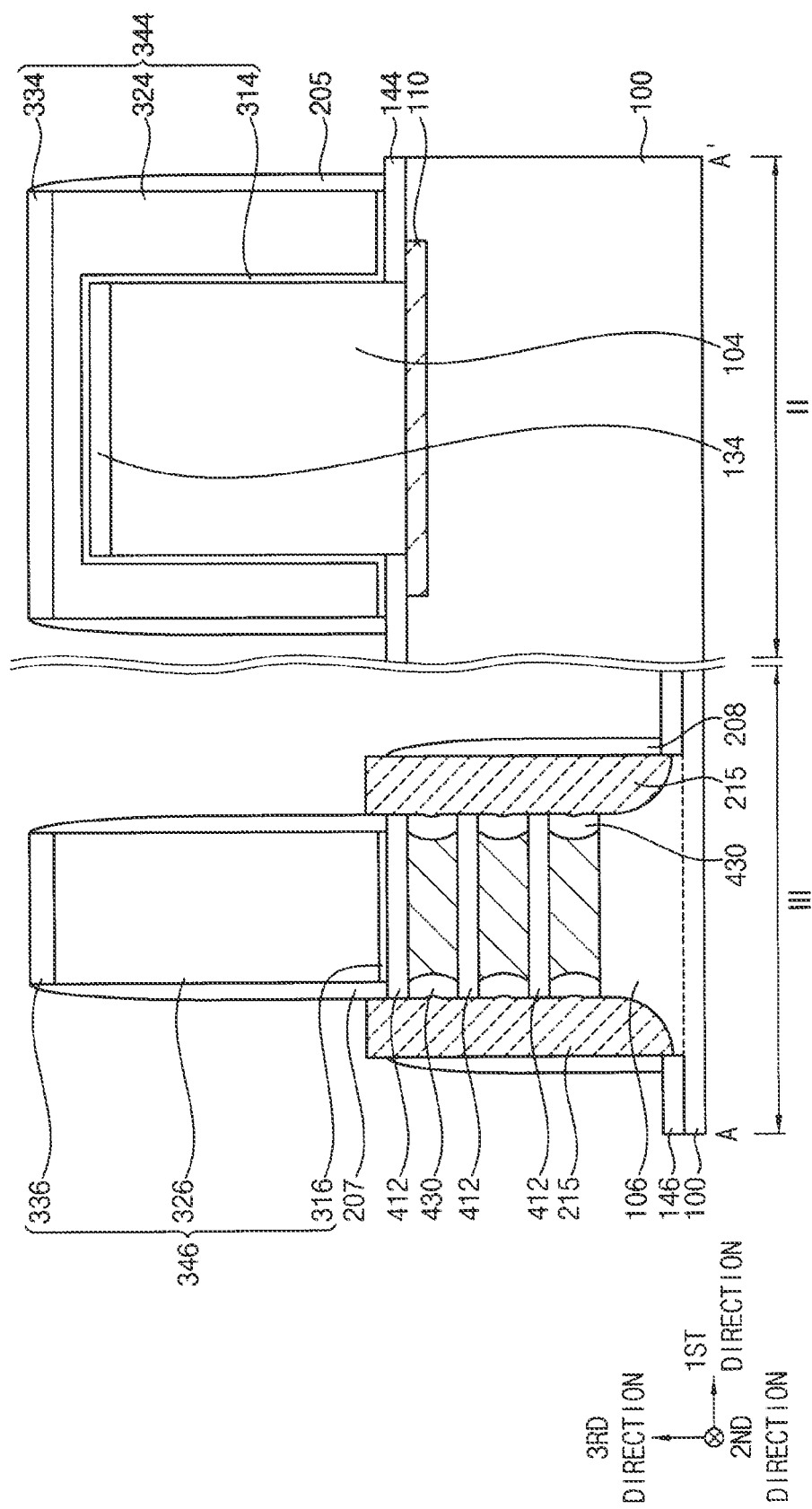
Figure 41:
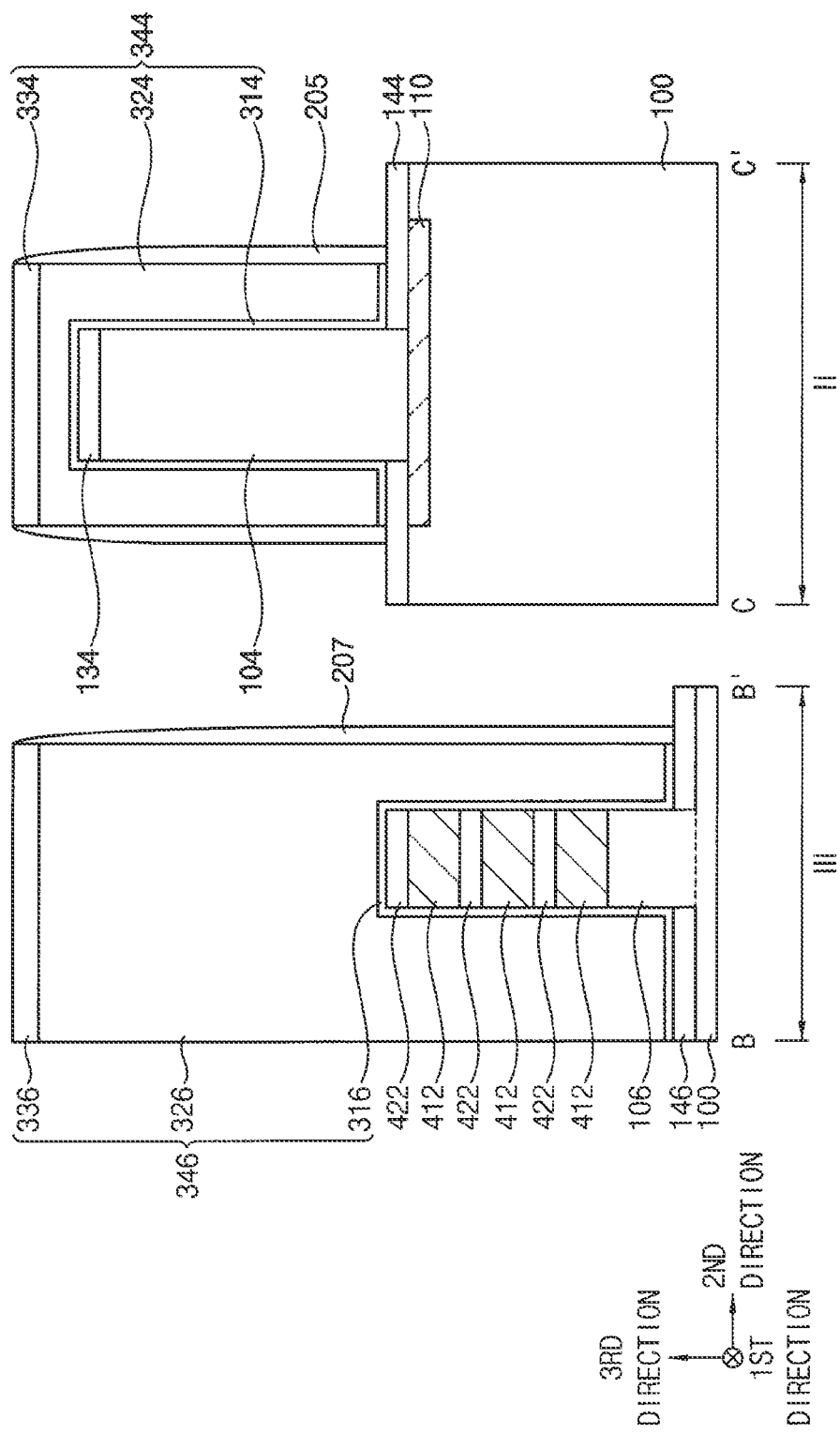

Referring to FIGS. 39 to 41, processes substantially the same as or similar to those illustrated with reference to FIGS. 24 and 25 may be performed, so that the seventh spacer 205 may be formed on the sidewall of the second dummy gate structure 344, a ninth spacer 207 may be formed on a sidewall of the third gate structure 346, and a tenth spacer 208 may be formed on a sidewall of the third semiconductor pattern 106.

A portion of the third semiconductor pattern 106 not covered by the third dummy gate structure 346 and the tenth spacer 208 may be etched to form a ninth recess, a lateral portion of each of the second sacrificial patterns 412 exposed by the ninth recess may be removed to form a gap, and an eleventh spacer 430 may be formed in the gap.

The eleventh spacer 430 may have a concave shape at a central portion in the third direction. In an implementation, the eleventh spacer 430 may have a cross-section taken along the first direction having a shape of a horseshoe or a semicircle with a concave sidewall. In an implementation, the eleventh spacer 430 may have a shape of a rectangle with a concave sidewall and rounded corners. The eleventh spacer 430 may include a nitride, e.g., silicon nitride.

An SEG process may be performed using a portion of the third semiconductor pattern 106 exposed by the ninth recess and sidewalls of the fourth semiconductor patterns 422 exposed by the ninth recess as a seed to form a fourth impurity region 215 in the ninth recess.

Figure 42:
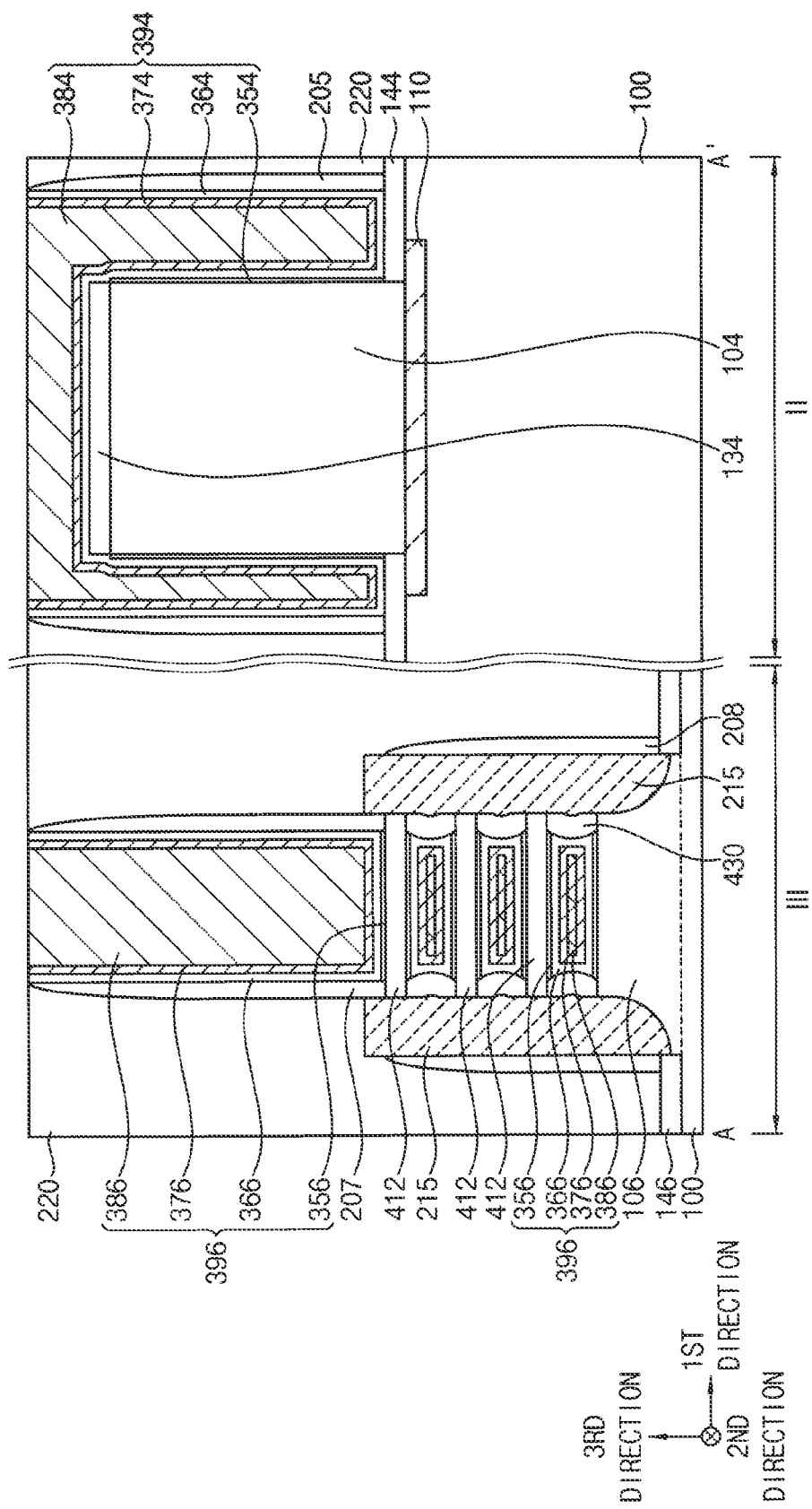
Figure 43:
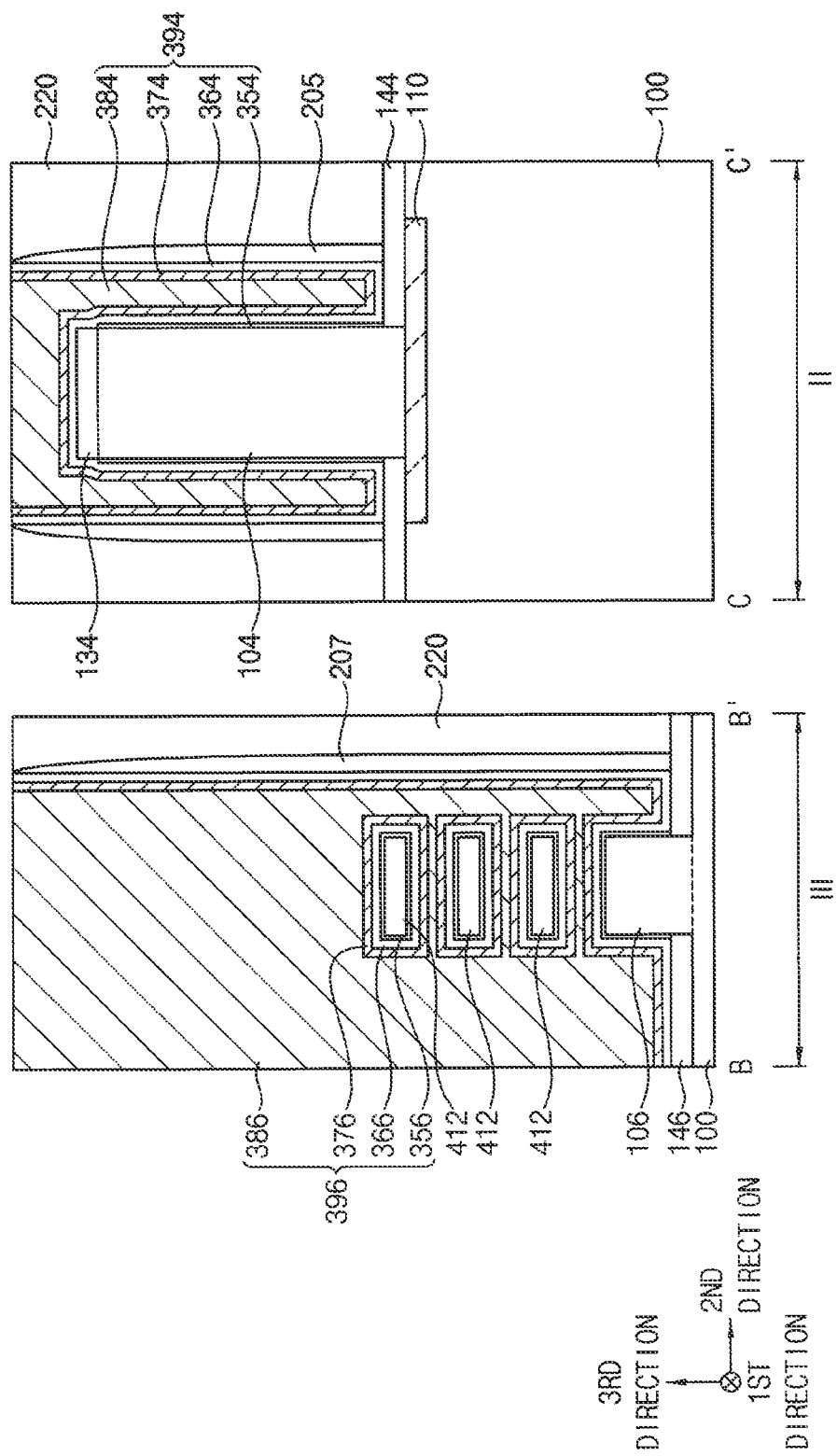

Referring to FIGS. 42 and 43, processes substantially the same as or similar to those illustrated with reference to FIGS. 26 and 27 may be performed.

In an implementation, the first insulating interlayer 220 may be formed on the second and eighth spacers 144 and 146 to cover the second and third gate structures 344 and 346, the seventh, ninth and tenth spacers 205, 207 and 208, and the fourth impurity region 215, and may be planarized until upper surfaces of the second and third dummy gate masks 334 and 336 are exposed.

The exposed second dummy gate mask 334, and the second dummy gate electrode 324 and the second dummy gate insulation pattern 314 thereunder may be removed to form a tenth recess exposing the upper surface and the sidewall of the second hard mask 134, the sidewall of the second semiconductor pattern 104, the upper surface of the second spacer 144 and the inner sidewall of the seventh spacer 205. In an implementation, the exposed third dummy gate mask 336, and the third dummy gate electrode 326, the third dummy gate insulation pattern 316 and the second sacrificial patterns 412 thereunder may be removed to form an eleventh recess exposing an upper surface and a sidewall of the third semiconductor pattern 106, an upper surface of the eighth spacer 146 and an inner sidewall of the ninth spacer 207.

The fourth interface pattern 354 may be formed on the upper surface and the sidewall of the second semiconductor pattern 104 exposed by the tenth recess, and a fifth interface pattern 356 may be formed on the upper surface and the sidewall of the third semiconductor pattern 106 exposed by the eleventh recess. A gate insulation layer, a work function control layer and a gate electrode layer may be sequentially formed in the tenth and eleventh recesses.

The gate electrode layer, the work function control layer and the gate insulation layer may be planarized until the upper surface of the first insulating interlayer 220 is exposed to form a fourth gate structure 394 in the tenth recess on the second region II of the substrate 100 and to form a fifth gate structure 396 in the eleventh recess on the third region III of the substrate 100. The fifth gate structure 396 may include a fifth interface pattern 356, a fifth gate insulation pattern 366, a third work function control pattern 376 and a fifth gate electrode 386.

Figure 44:
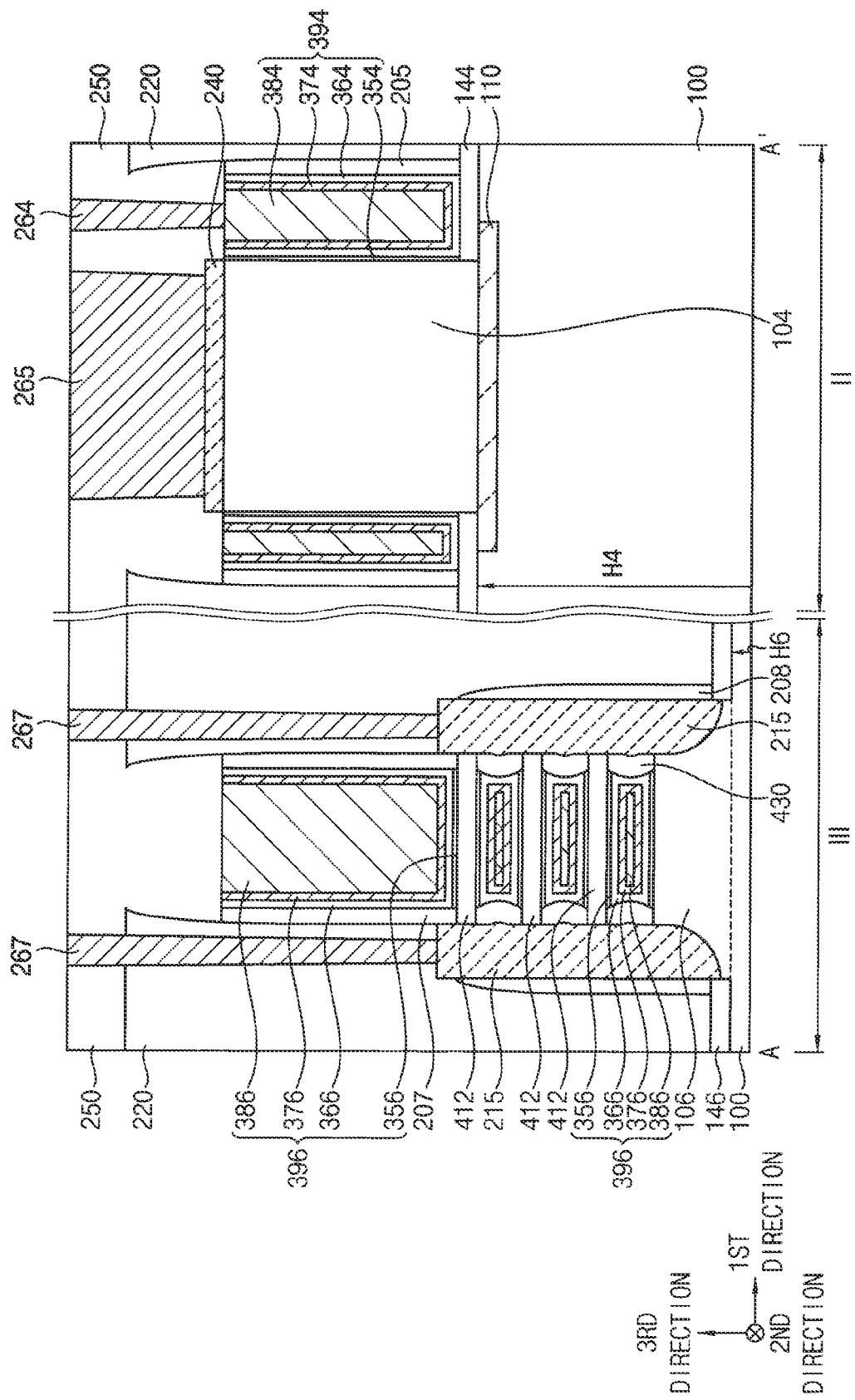

Referring to FIGS. 44 and 45, processes substantially the same as or similar to those illustrated with reference to FIGS. 28 to 31 may be performed to complete the fabrication of the semiconductor device.

In an implementation, the third to fifth contact plugs 264, 265 and 266 may be formed on the second region II of the substrate 100, and a sixth contact plug 267 may be formed through the first and second insulating interlayers 220 and 250 to contact an upper surface of the fourth impurity region 215 on the third region III of the substrate 100.

By the above processes, a vFET and a multi-bridge channel field effect transistor (MBCFET) may be formed on the second and third regions II and III, respectively, of the substrate 100, and the semiconductor device may have the following structural characteristics.

In an implementation, the second transistor may be formed on the second region II of the substrate 100, and may include the fourth gate structure 394, the second semiconductor pattern 104 serving as a channel, and the first and third impurity regions 110 and 240, serving as source/drain layers, respectively.

In an implementation, the third transistor may be formed on the third region III of the substrate 100, and may include the third semiconductor pattern 106 extending (e.g., lengthwise) in the first direction and protruding from the upper surface of the third region III of the substrate 100 upwardly in the third direction, the fifth gate structure 396 extending in the second direction on the third semiconductor pattern 106, the fourth semiconductor patterns 422 spaced apart from each other in the third direction each of which may extend through the fifth gate structure 396 in the first direction, and fourth impurity regions 215 on respective portions of the third semiconductor patterns 106 at opposite sides of the fifth gate structure 396 in the first direction.

Each of the fourth semiconductor patterns 422 may serve as a channel of the third transistor, and the fourth impurity regions 215 may include impurities having the same conductivity type and serve as the source/drain layers, respectively. In an implementation, the third transistor may be an MBCFET.

In an implementation, the upper surface of the third region III of the substrate 100 may be lower than the upper surface of the second region II of the substrate 100. In an implementation, an upper surface of the fifth gate structure 396 may be substantially coplanar with an upper surface of the fourth gate structure 394.

In an implementation, the fourth and fifth gate structures 394 and 396 may be formed on the second and eighth spacers 144 and 146, respectively.

In an implementation, the ninth spacer 207 covering a portion of a sidewall of the fifth gate structure 396 and the tenth spacer 208 covering a sidewall of the fourth impurity region 215 may be formed on the third region III of the substrate 100. In an implementation, the eleventh spacer 430 may be further formed between the fourth semiconductor patterns 422 and between the third and fourth semiconductor patterns 106 and 422 on the third region III of the substrate 100. The eleventh spacer 430 may be formed between the fifth gate structure 396 and each of the fourth impurity regions 215.

In an implementation, the fifth gate structure 396 may include the fifth interface pattern 356 on a surface of the third semiconductor pattern 106 and a surface of each of the fourth semiconductor patterns 422, and the fifth gate insulation pattern 366, the third work function control pattern 376 and the fifth gate electrode 386 sequentially stacked from a surface of the fifth interface pattern 356, an upper surface of the eighth spacer 146, and inner sidewalls of the ninth and eleventh spacers 207 and 430.

FIG. 46 is a cross-sectional view of a semiconductor device in accordance with example embodiments.

This semiconductor device may include a finFET, a vFET, and an MBCFET on the first to third regions I, II and III, respectively, of the substrate 100. The finFET and the vFET may be substantially the same or similar to those of FIGS. 30 and 31, and the MBCFET may be substantially the same or similar to those of FIGS. 44 and 45.

The third height H3 of the upper surface of the first region I of the substrate 100 may be less than the fourth height H4 of the upper surface of the second region II of the substrate 100, and the sixth height H6 of the upper surface of the third region III of the substrate 100 may be less than the third height H3 of the upper surface of the first region I of the substrate 100. In an implementation, a thickness of the first region I of the substrate 100 in the third direction (e.g., corresponding with H3) may be less than a thickness of the second region II of the substrate 100 in the third direction (e.g., corresponding with H4). In an implementation, a thickness of the third region III of the substrate 100 in the third direction (e.g., corresponding with H6) may be less than a thickness of the first region I of the substrate 100 in the third direction (e.g., corresponding with H3).

By way of summation and review, when the vFET includes a plurality of gates, the gates may be etched by performing an etching process twice, which may generate distribution of lengths of the gates in a vertical direction.

One or more embodiments may provide a semiconductor device including both of a finFET and a vFET.

One or more embodiments may provide a semiconductor device having good characteristics.

The semiconductor device may include the finFET and/or the MBCFET together with the vFET, and the gate structures of the vFET may have a small distribution of or variation in lengths in the vertical direction so as to have improved electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
   forming a first impurity region in a portion of a second region of a substrate, the substrate including a first region and the second region;
   removing an upper portion of the first region of the substrate so that an upper surface of the first region of the substrate is lower than an upper surface of the second region of the substrate;
   partially removing the first region and the second region of the substrate to form a first semiconductor pattern and a second semiconductor pattern, respectively;
   forming a first gate structure and a second gate structure on the first semiconductor pattern and the second semiconductor pattern, respectively, of the substrate;
   forming an insulating interlayer on the substrate to cover the first gate structure and the second gate structure;
   removing an upper portion of the insulating interlayer and an upper portion of the second gate structure to expose an upper surface of the second semiconductor pattern; and
   forming a second impurity region at an upper portion of the second semiconductor pattern.

2. The method of claim 1, wherein removing the upper portion of the insulating interlayer and the upper portion of the second gate structure to expose the upper surface of the second semiconductor pattern includes performing a chemical mechanical polishing (CMP) process on the upper portion of insulating interlayer and the upper portion of the second gate structure.

3. The method of claim 1, wherein forming the second impurity region at the upper portion of the second semiconductor pattern includes doping impurities into the upper portion of the second semiconductor pattern by an ion implantation process.

4. The method of claim 1, wherein forming the second impurity region at the upper portion of the second semiconductor pattern includes:
   removing an upper portion of the second semiconductor pattern; and
   performing a selective epitaxial growth (SEG) process using an upper surface of the second semiconductor pattern as a seed.

5. The method of claim 1, wherein the first impurity region and the second impurity region include impurities having a same conductivity type.

6. The method of claim 1, further comprising forming a first spacer and a second spacer on a sidewall of the first gate structure and a sidewall of the second gate structure, respectively.

7. The method of claim 6, further comprising, after forming the first spacer and the second spacer:
   removing an upper portion of the first semiconductor pattern not covered by the first gate structure and the first spacer to form a recess; and
   performing a selective epitaxial growth (SEG) process using a portion of the first semiconductor pattern exposed by the recess to form a third impurity region.

8. The method of claim 1, further comprising forming a first contact plug, a second contact plug, a third contact plug, a fourth contact plug and a fifth contact plug on the first gate structure, the third impurity region, the second gate structure, the second impurity region and the first impurity region, respectively.

9. The method of claim 1, wherein partially removing the first region and the second region of the substrate to form the first semiconductor pattern and the second semiconductor pattern, respectively, includes:
   forming a first hard mask and a second hard mask on the first region and the second region, respectively, of the substrate; and
   etching a portion of the first region of the substrate and a portion of the second region of the substrate using the first hard mask and the second hard mask as an etching mask to form the first semiconductor pattern and the second semiconductor pattern, respectively.

10. The method of claim 9, further comprising, after forming the first semiconductor pattern and the second semiconductor pattern:
    forming a sacrificial layer on the substrate to cover the first semiconductor pattern and the second semiconductor pattern;
    removing a portion of the sacrificial layer on the first region of the substrate to expose an upper surface of the first hard mask;
    removing the exposed first hard mask; and
    removing the sacrificial layer.

11. The method of claim 10, wherein forming the first gate structure and the second gate structure on the first semiconductor pattern and the second semiconductor pattern, respectively, of the substrate includes forming the first gate structure on the first semiconductor pattern and forming the second gate structure on the second hard mask.

12. The method of claim 11, wherein removing the upper portion of the insulating interlayer and the upper portion of the second gate structure to expose the upper surface of the second semiconductor pattern includes:
    removing an upper portion of the insulating interlayer and a portion of the second gate structure on the second hard mask; and
    removing the second hard mask to expose the upper surface of the second semiconductor pattern.

13. A method of manufacturing a semiconductor device, the method comprising:
    forming a first impurity region in a portion of a second region of a substrate, the substrate including a first region and the second region;
    removing an upper portion of the first region of the substrate so that an upper surface of the first region of the substrate is lower than an upper surface of the second region of the substrate;
    partially removing the first region and the second region of the substrate to form a first semiconductor pattern and a second semiconductor pattern, respectively;
    forming a first gate structure and a second gate structure on the first semiconductor pattern and the second semiconductor pattern, respectively, of the substrate;
    removing an upper portion of the first gate structure and an upper portion of the second gate structure to expose an upper surface of the second semiconductor pattern; and
    forming a second impurity region at an upper portion of the second semiconductor pattern.

14. The method of claim 13, wherein forming the first gate structure and the second gate structure on the first semiconductor pattern and the second semiconductor pattern, respectively, of the substrate includes:
    forming a first dummy gate structure and a second dummy gate structure on the first semiconductor pattern and the second semiconductor pattern, respectively, of the substrate;
    forming a first spacer and a second spacer on a sidewall of the first dummy gate structure and a sidewall of the second dummy gate structure, respectively;
    forming an insulating interlayer on the substrate to cover a sidewall of the first spacer and a sidewall of the second spacer;
    removing the first dummy gate structure and the second dummy gate structure to form a first recess and a second recess, respectively; and
    forming the first gate structure and the second gate structure in the first recess and the second recess, respectively.

15. The method of claim 13, wherein partially removing the first region and the second region of the substrate to form the first semiconductor pattern and the second semiconductor pattern, respectively, includes:
    forming a first hard mask and a second hard mask on the first region and the second region, respectively, of the substrate; and
    etching a portion of the first region of the substrate and a portion of the second region of the substrate using the first hard mask and the second hard mask as an etching mask to form the first semiconductor pattern and the second semiconductor pattern, respectively.

16. The method of claim 15, further comprising, after forming the first semiconductor pattern and the second semiconductor pattern:
    forming a sacrificial layer on the substrate to cover the first semiconductor pattern and the second semiconductor pattern;
    removing a portion of the sacrificial layer on the first region of the substrate to expose an upper surface of the first hard mask;
    removing the exposed first hard mask; and
    removing the sacrificial layer.

17. A method of manufacturing a semiconductor device, the method comprising:
    forming a first impurity region in a portion of a second region of a substrate, the substrate including a first region and the second region;
    removing an upper portion of the first region of the substrate so that an upper surface of the first region of the substrate is lower than an upper surface of the second region of the substrate;
    alternately and repeatedly stacking first sacrificial layers and semiconductor layers on the first region of the substrate;
    partially removing the semiconductor layers, the first sacrificial layers, the first region of the substrate and the second region of the substrate to form third semiconductor patterns, first sacrificial patterns, a first semiconductor pattern and a second semiconductor pattern, respectively;
    forming a first gate structure and a second gate structure on the first semiconductor pattern and the second semiconductor pattern, respectively, of the substrate, the first gate structure surrounding at least a portion of each of the third semiconductor patterns;
    removing an upper portion of the first gate structure and an upper portion of the second gate structure to expose an upper surface of the second semiconductor pattern; and forming a second impurity region at an upper portion of the second semiconductor pattern.

18. The method of claim 17, wherein forming the first gate structure and the second gate structure on the first semiconductor pattern and the second semiconductor pattern, respectively, of the substrate includes:
    forming a first dummy gate structure and a second dummy gate structure on the first semiconductor pattern and the second semiconductor pattern, respectively, of the substrate, the first gate structure surrounding at least a portion of each of the third semiconductor patterns and at least a portion of each of the first sacrificial patterns;
    forming a first spacer and a second spacer on a sidewall of the first dummy gate structure and a sidewall of the second dummy gate structure, respectively;
    forming an insulating interlayer on the substrate to cover a sidewall of the first spacer and a sidewall of the second spacer;
    removing the first dummy gate structure, the first sacrificial patterns and the second dummy gate structure to form a first recess, a second recess and a third recess, respectively; and
    forming the first gate structure in the first and second recesses and the second gate structure in the third recess.

19. The method of claim 17, wherein partially removing the semiconductor layers, the first sacrificial layers, the first region of the substrate and the second region of the substrate to form the third semiconductor patterns, the first sacrificial patterns, the first semiconductor pattern and the second semiconductor pattern, respectively, includes:
    forming a first hard mask and a second hard mask on an uppermost one of the semiconductor layers and the second region of the substrate, respectively; and
    etching portions of the semiconductor layers, the first sacrificial layers and the first region of the substrate using the first hard mask as an etching mask to form the third semiconductor patterns, the first sacrificial patterns and the first semiconductor pattern, respectively, and etching a portion of the second region of the substrate using the second hard mask as an etching mask to form the second semiconductor pattern.

20. The method of claim 19, further comprising, after forming the third semiconductor patterns, the first sacrificial patterns, the first semiconductor pattern and the second semiconductor pattern:
    forming a second sacrificial layer on the substrate to cover the third semiconductor patterns, the first sacrificial patterns, the first semiconductor pattern and the second semiconductor pattern;
    removing a portion of the second sacrificial layer on the first region of the substrate to expose an upper surface of the first hard mask;
    removing the exposed first hard mask; and
    removing the second sacrificial layer.

* * * * *